United States Patent
Masuda

(10) Patent No.: US 9,023,171 B2
(45) Date of Patent: May 5, 2015

(54) METHOD FOR MANUFACTURING DISPLAY PANEL

(71) Applicant: Panasonic Corporation, Osaka (JP)

(72) Inventor: Hiroyuki Masuda, Osaka (JP)

(73) Assignee: Joled Inc, Tokyo (JP)

( * ) Notice: Subject to any disclaimer, the term of this patent is extended or adjusted under 35 U.S.C. 154(b) by 58 days.

(21) Appl. No.: 13/671,599

(22) Filed: Nov. 8, 2012

(65) Prior Publication Data

US 2013/0306235 A1    Nov. 21, 2013

Related U.S. Application Data

(63) Continuation of application No. PCT/JP2012/003287, filed on May 18, 2012.

(51) Int. Cl.
| B29C 65/16 | (2006.01) |
| H05B 33/10 | (2006.01) |
| H01L 51/52 | (2006.01) |

(52) U.S. Cl.
CPC ............ *H05B 33/10* (2013.01); *H01L 51/5246* (2013.01)

(58) Field of Classification Search
CPC .......... H05B 33/10; B29C 65/16; G09F 9/30; H01L 51/5246
USPC .................. 156/272.2, 272.8, 99, 109, 273.3, 156/273.5, 275.5, 275.7
See application file for complete search history.

(56) References Cited

U.S. PATENT DOCUMENTS

| 5,985,069 | A * | 11/1999 | Kawabe et al. | ............... 156/109 |
| 6,478,915 | B1 * | 11/2002 | Schmalbruch et al. | ........ 156/216 |
| 2003/0025867 | A1 | 2/2003 | Yoshizoe et al. | |
| 2012/0287026 | A1 | 11/2012 | Masuda | |

FOREIGN PATENT DOCUMENTS

| JP | 10-116560 | | 5/1998 |
| JP | 2001-125115 | | 5/2001 |
| JP | 2001125115 A | * | 5/2001 |
| JP | 2002-098979 | | 4/2002 |
| JP | 2003-043499 | | 2/2003 |
| JP | 2004323833 A | * | 11/2004 |
| JP | 2010145897 A | * | 7/2010 |
| JP | 2010-177445 | | 8/2010 |
| JP | 2011-018479 | | 1/2011 |
| JP | 2011018479 A | * | 1/2011 |

OTHER PUBLICATIONS

Machine Translation of JP 2010145897 A, Jul. 2010.*
Machine Translation of JP 2011018479 A, Jan. 2011.*
U.S. Appl. No. 13/609,558 to Hiroko Okumura et al., filed Sep. 11, 2012.
International Search Report in Japanese dated May 18, 2012.

* cited by examiner

*Primary Examiner* — Daniel McNally
(74) *Attorney, Agent, or Firm* — Greenblum & Bernstein, P.L.C.

(57) ABSTRACT

A manufacturing method of a display panel comprises applying a paste including a sealing material to a substrate by using a nozzle, the nozzle being moved along a display region on the substrate from a start position located in a vicinity of the display region to an end position, so as to surround the display region. In the applying, the paste is applied such that a center line of the paste in an end region is substantially parallel to and separate from a center line of the paste in a start region, and a distance of separation between the center line of the paste in the end region and the center line of the paste in the start region is less than a width of the paste in a region other than the start region and the end region.

16 Claims, 20 Drawing Sheets

FIG. 9A-1
FIG. 9A-2
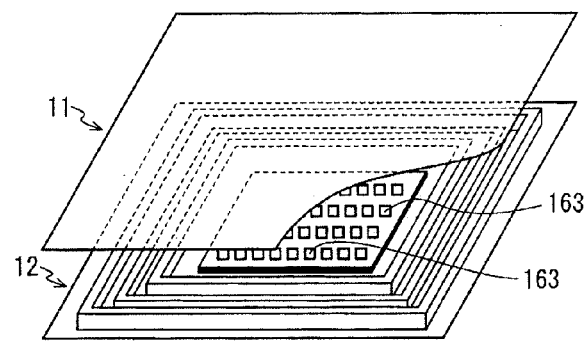
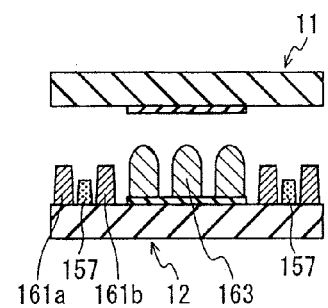
FIG. 9B-1
FIG. 9B-2
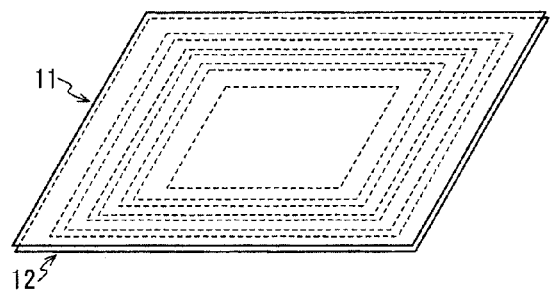
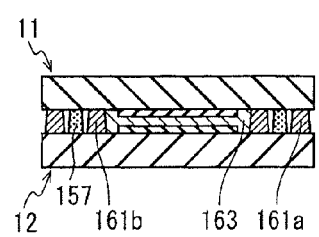
FIG. 9C-1
FIG. 9C-2
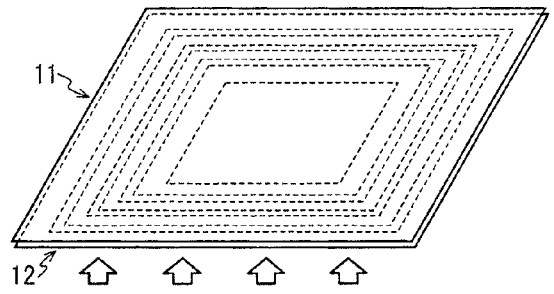
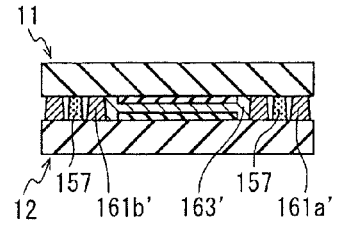
FIG. 9D-1
FIG. 9D-2
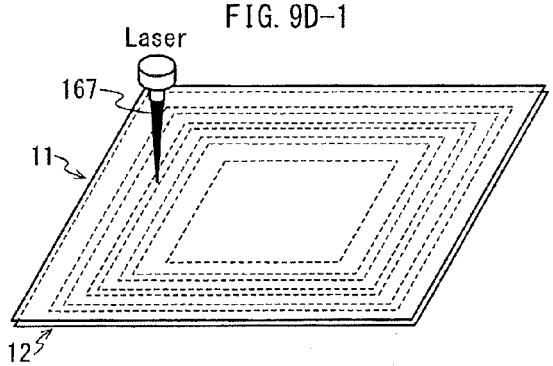
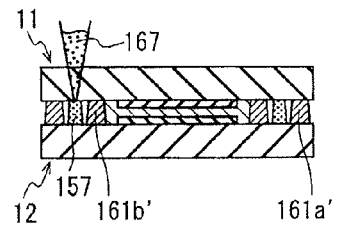

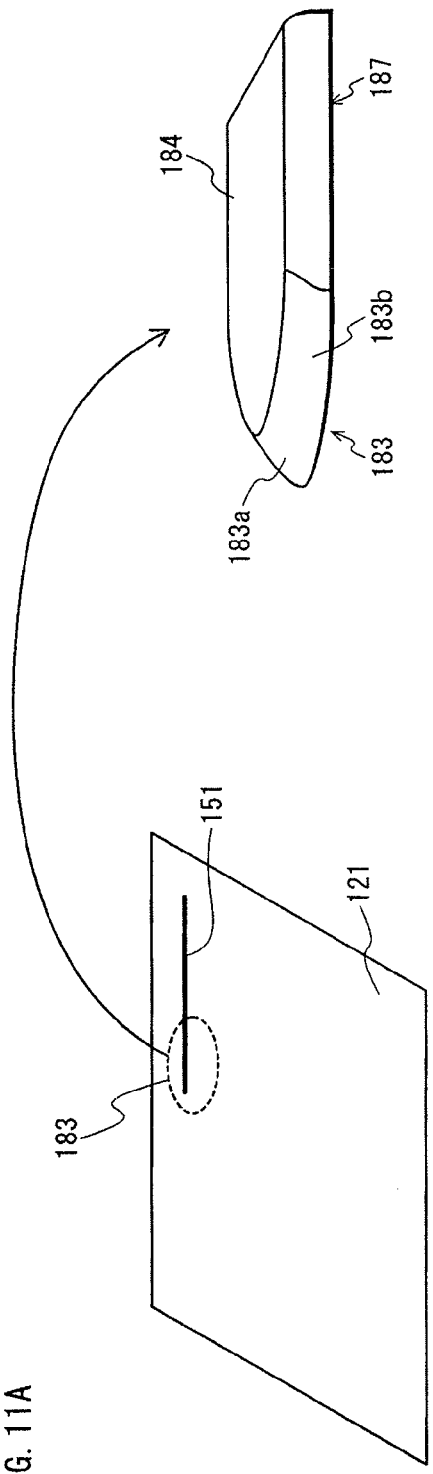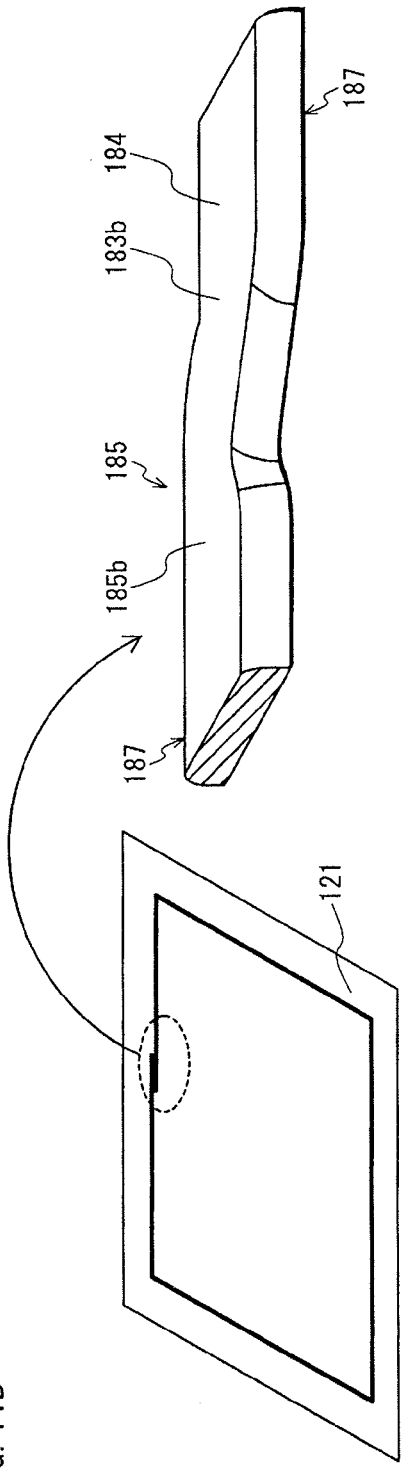
FIG. 11A
FIG. 11B

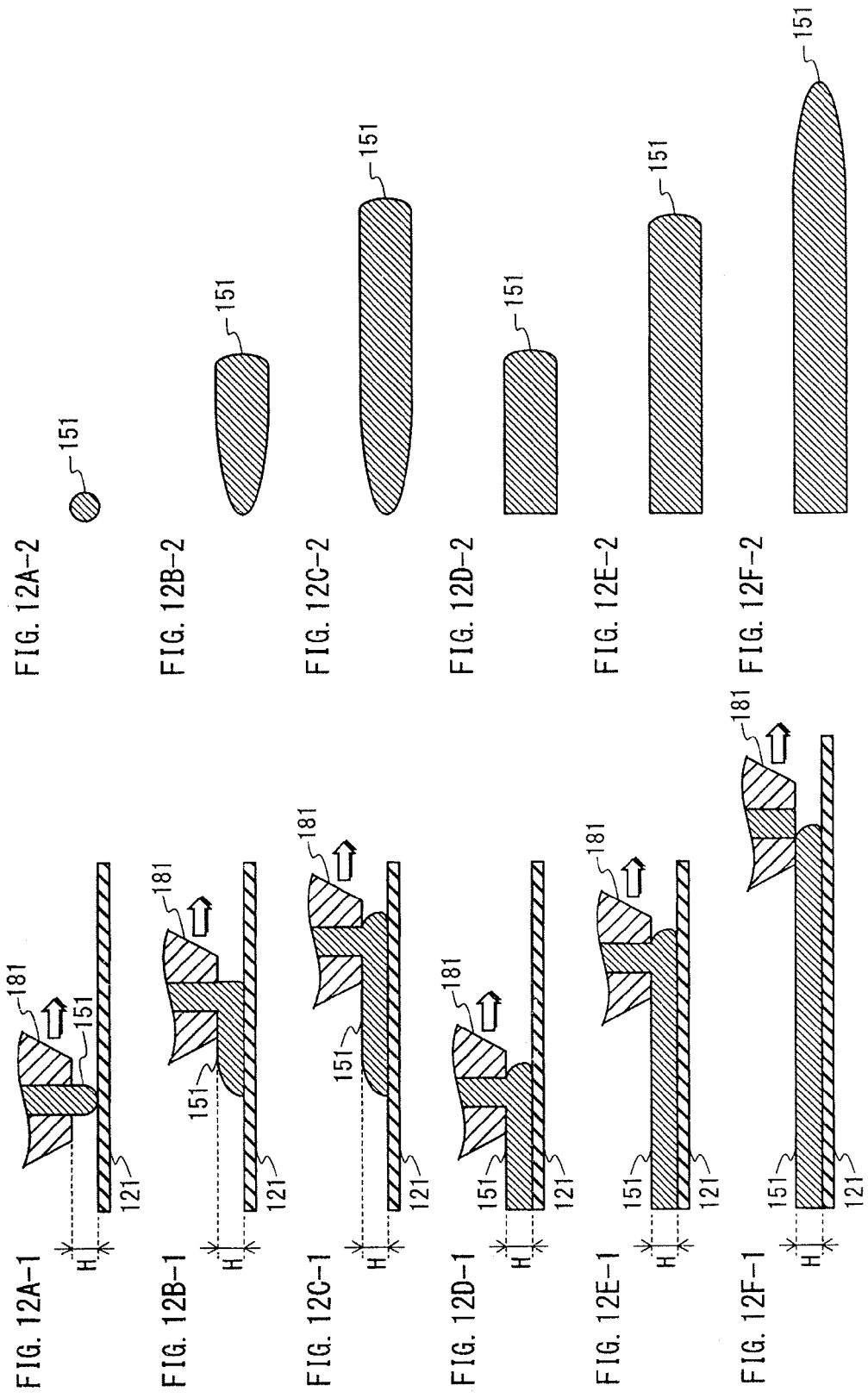

METHOD FOR MANUFACTURING DISPLAY PANEL

CROSS REFERENCE TO RELATED APPLICATION

This is a continuation application of PCT Application No. PCT/JP2012/003287 filed on May 18, 2012, designating the United States of America, the disclosure of which, including the specification, drawings and claims, is incorporated herein by reference in its entirety.

TECHNICAL FIELD

The present disclosure relates to a method for manufacturing a display panel in which a display region is sealed by a sealing member, the display region being arranged between two substrates facing each other, the sealing member surrounding the display region and provided between the substrates.

DESCRIPTION OF THE RELATED ART

Organic electroluminescence (EL) elements are self-luminescent, and therefore have various advantages. For example, the EL elements do not require backlight, and have a wide viewing angle. Also, using such EL elements makes it easy to manufacture a thinner display and to reduce power consumption. Furthermore, the EL elements have a quick response speed. Accordingly, organic EL display panels having such organic EL elements in rows have attracted great attention as next-generation displays that replace liquid crystal display devices.

Typical organic EL elements have an organic EL laminate on a substrate, and the organic EL laminate includes a lower electrode, organic material layers including a light-emitting layer, and an upper electrode laminated in the stated order.

Materials constituting the organic EL laminate are generally highly active and unstable, and therefore easily react with moisture and oxygen present in the air. Such a reaction with moisture and oxygen leads to significant deterioration of the characteristics of organic EL elements. It is therefore necessary that the organic EL elements in an organic EL display panel are sealed against ambient air.

Accordingly, a sealing member is provided to prevent deterioration of light emitting elements, such as organic EL elements constituting a display region, by the infiltration of moisture or oxygen from the outside atmosphere.

Sealing of the display region is performed by: applying a paste (e.g., glass paste) including a sealing material (e.g., frit glass) to one of two substrates so as to surround the display region (i.e., a region in which the elements are to be formed); joining the other substrate to the substrate on which the paste has been applied; and melting (baking) the sealing material.

Representative methods for applying a paste to a substrate include a screen printing method using a screen mask, and a dispenser method using a nozzle. According to the screen printing method, the usage efficiency of a paste is not as good as the dispenser method because the paste needs to be applied to the entirety of a screen printing plate. For this reason, the dispenser method is more commonly used, along with an increase in the screen size of a display panel in recent years (Patent Literature 1).

According to the dispenser method, a paste stored in a cylinder is ejected from a nozzle to apply the paste. The nozzle starts ejecting the paste from a start position on a substrate, and moves from the start position along a display region (i.e., a region in which the elements are to be formed) to an end position so as to surround the display region.

CITATION LIST

Patent Literature

Patent Literature 1: Japanese Patent Application Publication No. H10-116560

SUMMARY

With the aforementioned dispenser method, however, it is difficult to adjust the dimensions of the paste applied to a start region including the start position (hereinafter, "start portion of the paste" or simply "start portion") and the paste applied to an end region including the end position (hereinafter, "end portion of the paste" or simply "end portion").

For example, if a gap exists between the start portion and end portion of the applied paste, the display region cannot be sealed completely. On the other hand, if the paste is applied such that the end portion overlaps the start portion, and that the center line of the end portion coincides with the center line of the start portion, the thickness of the overlap portion tends to be too large as compared to the thickness of the paste applied in a region other than the start region and the end region. Also, if the inner side of the end portion is applied along and parallel to the outer side of the start portion, the width of the parallel portion becomes too large as compared to the width of the portion of the paste other than the parallel portion. This causes the substrates to be relatively large to the display region. Consequently, the above dispenser method cannot meet the demand for reduction in the width of the frame of a display panel.

One non-limiting and exemplary embodiment is directed to a manufacturing method of a display panel in which sealing properties thereof are maintained, a paste has a uniform thickness, and the width of the paste is small in a region where the start region and the end region overlap.

In one general aspect, the techniques disclosed here feature a manufacturing method of a display panel, comprising: applying a paste including a sealing material to a first substrate by using a nozzle, the nozzle being moved relative to the first substrate along a display region on the first substrate from a start position located in a vicinity of the display region to an end position, so as to surround the display region; integrating the sealing material with the first substrate by heating the paste applied to the first substrate; and joining the first substrate and a second substrate with the sealing material therebetween, and sealing the first substrate and the second substrate by welding the sealing material to the second substrate, wherein in the applying, the paste is applied such that a center line of the paste applied in an end region including the end position is substantially parallel to and separate from a center line of the paste applied in a start region including the start position, and a distance of separation between the center line of the paste applied in the end region and the center line of the paste applied in the start region is less than a width of the paste applied in a region other than the start region and the end region.

The paste is applied such that the center line of the paste applied in the end region is substantially parallel to and separate from the center line of the paste applied in the start region, where the distance of separation therebetween is less than the width of the paste applied in the region other than the start region and the end region. With the above structure, as compared to the case where the paste is applied such that the center line of the paste in the end region overlaps the center line of the paste in the start region, the height of the paste in the end region can be made uniform reliably, and the sealing properties can be maintained. Furthermore, as compared to when the paste in the end region is applied parallel to the paste in the start region so that the inner side of the paste in the end region is along the outer side of the paste in the start region, the width of the paste can be made small.

These general and specific aspects may be implemented using a device. Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

FIGS. 8A-1 to 8D-2 illustrate a CF process.

FIGS. 9A-1 to 9D-2 illustrate part of a bonding process.

FIG. 10A is a partial cutaway perspective view showing an interior of the nozzle.

FIGS. 11A and 11B show the frit paste applied on a glass substrate, where FIG. 11A is a magnified view showing a start portion, and FIG. 11B is a magnified view showing the start portion and an end portion.

FIGS. 12A-1 to 12F-2 illustrate application of the frit paste. FIGS. 12A-1 and 12B-1 illustrate application of the start portion. FIG. 12C-1 illustrates application of an intermediate portion. FIGS. 12D-1, 12E-1, and 12F-1 illustrate application of the end portion.

FIGS. 16A-1 to 16D-2 illustrate an EL process.

FIGS. 18A to 18C show states where the start portion and the end portion are applied.

Each of FIGS. 19A to 19E is a plan view of a connected portion where the start portion and the end portion are connected, and illustrates an example where the start portion and the end portion do not overlap.

Figure 20A:
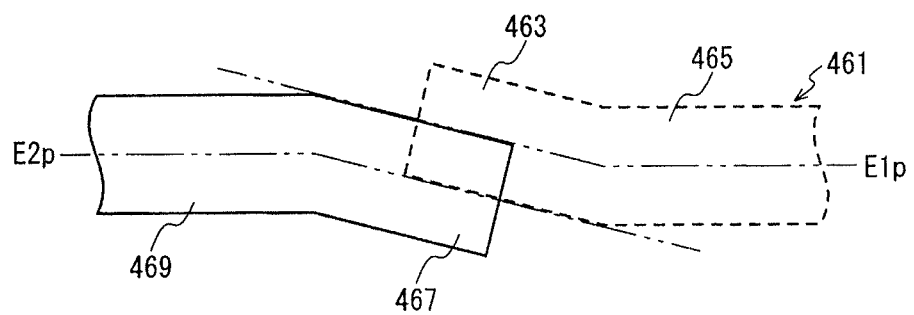
Figure 20B:
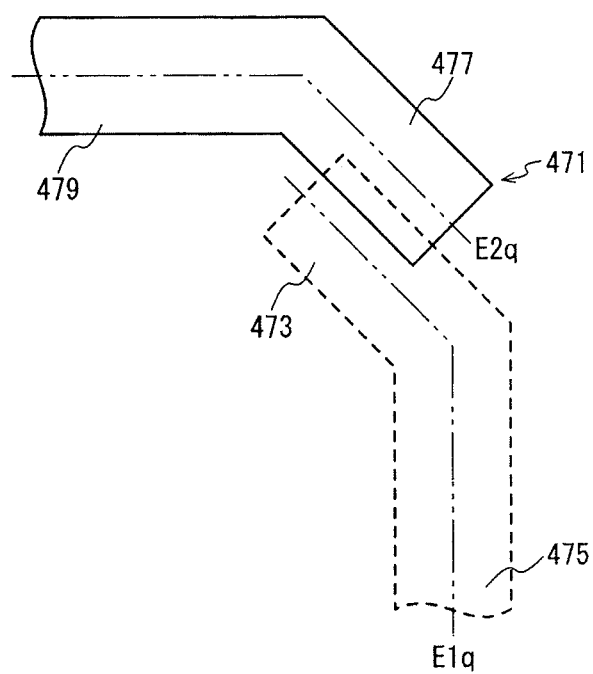

FIGS. 20A and 20B illustrate the start portion, the end portion, and the intermediate portion according to Modifications.

DETAILED DESCRIPTION

[Outline of Embodiments]

One embodiment provides a manufacturing method of a display panel, comprising: applying a paste including a sealing material to a first substrate by using a nozzle, the nozzle being moved relative to the first substrate along a display region on the first substrate from a start position located in a vicinity of the display region to an end position, so as to surround the display region; integrating the sealing material with the first substrate by heating the paste applied to the first substrate; and joining the first substrate and a second substrate with the sealing material therebetween, and sealing the first substrate and the second substrate by welding the sealing material to the second substrate, wherein in the applying, the paste is applied such that a center line of the paste applied in an end region including the end position is substantially parallel to and separate from a center line of the paste applied in a start region including the start position, and a distance of separation between the center line of the paste applied in the end region and the center line of the paste applied in the start region is less than a width of the paste applied in a region other than the start region and the end region.

In the above embodiment, the distance of the separation may be greater than half the width of the paste applied in the region other than the start region and the end region.

Alternatively, in the above embodiment, the width of the paste applied in the region other than the start region and the end region may be equal to a maximum width of the paste applied in the start region. Also, in the above embodiment, the nozzle may have a circular outlet from which the paste is ejected, and an end surface located around the outlet and opposing the first substrate, and the distance of the separation may be less than $(a+b)/2$, where $a$ denotes a diameter of the outlet, and $b$ denotes the width of the paste applied in the region other than the start region and the end region.

Furthermore, in the above embodiment, a width of the nozzle at the end surface may be larger than the width of the paste applied in the region other than the start region and the end region. Also, in the applying, the paste applied in part of the end region may at least partially overlap the paste applied in the start region, the part being located closer to the end position than other part of the end region.

Alternatively, in the applying, the paste applied in the end region may overlap the paste applied in part of the start region, the part being located closer to the start position than other part of the start region. Also, the paste applied in the start region in the applying may have an inclined side face which, in a plan view, is inclined toward the center line of the paste applied in the start region, in a direction approaching a start edge of the paste applied in the start region.

Furthermore, the paste applied in the end region in the applying may have an inclined side face which, in a plan view, is inclined toward the center line of the paste applied in the end region, in a direction approaching an end edge of the paste applied in the end region. Also, one of the start region and the end region may be located closer to a periphery of the first substrate than the other, the paste applied in the region closer to the periphery may have an inclined side face positioned at an inner side of the paste, the paste applied in the other one of the start region and the end region may have an inclined side face positioned at an outer side of the paste, and the inclined side face at the inner side and the inclined side face at the outer side may overlap.

Alternatively, the nozzle may be moved at a predetermined distance from the first substrate. Also, the nozzle may be moved while maintaining a predetermined distance from the first substrate, regardless of whether in the start region, the end region, or the region other than the start region and the end region.

Furthermore, a width of the nozzle may be at least twice as large as the diameter of the outlet. Also, after the first substrate and the second substrate are joined with the sealing material therebetween in the joining, the sealing material may be melted by irradiating the sealing material with a laser beam.

Embodiments

The following describes a method for manufacturing a display panel according to embodiments of the present disclosure, with reference to the drawings. In the embodiments described below, the materials, values, and so on are described by means of examples, and no limitations are intended thereby. Further, appropriate modifications may be made to the following embodiments provided that these do not deviate from the technical concept of the present disclosure. Further still, the following embodiments may be combined with each other, provided that no contradictions arise.

Embodiment 1

1. Structure (1) Overall Structure

Figure 1:
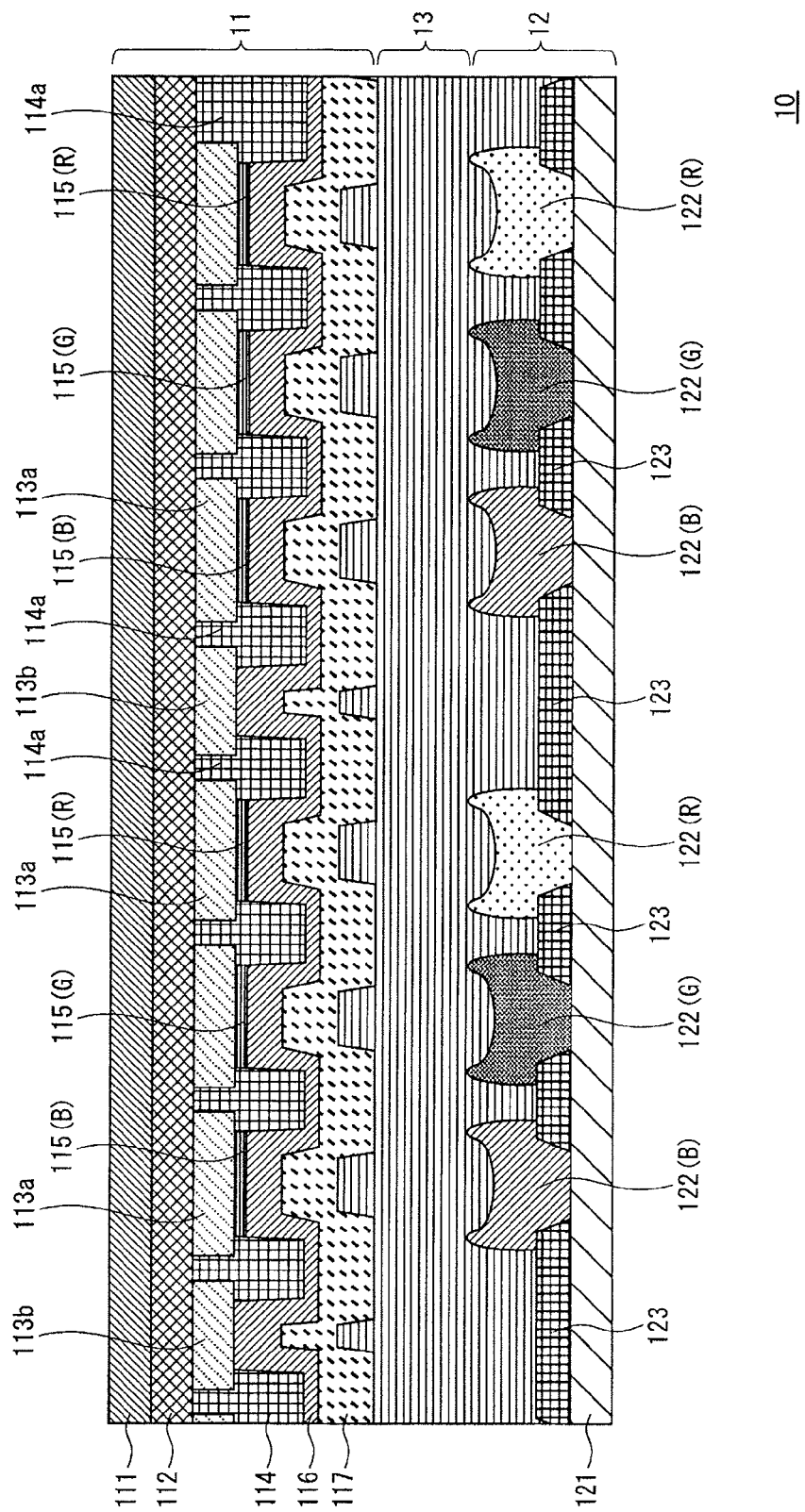
FIG. 1 is a partial cross-sectional view schematically showing a main part of a display panel according to Embodiment 1.

FIG. 1 is a partial cross-sectional view schematically showing a main part of a display panel 10 according to Embodiment 1.

A substrate on which organic EL elements are mounted is referred to as an EL substrate. A substrate on which color filters are mounted is referred to as a CF substrate.

As shown in FIG. 1, the display panel 10 includes an EL substrate 11, a CF substrate 12, and a sealing resin layer 13 which are provided between the EL substrate 11 and the CF substrate 12.

The sealing resin layer 13 is formed by curing a resin material. The sealing resin layer 13 is provided for the purpose of bonding the EL substrate 11 and the CF substrate 12 together, and also for the purpose of preventing moisture and gas from entering the EL substrate 11 from outside the display panel 10.

It is assumed that the light output surface of the display panel 10 is the top or upper surface thereof. The light output surface is shown in the lower side of FIG. 1.

(2) EL Substrate

The EL substrate 11 includes a substrate, an interlayer insulation film, an anode, a bank, a light-emitting layer, and so on.

Figure 2:
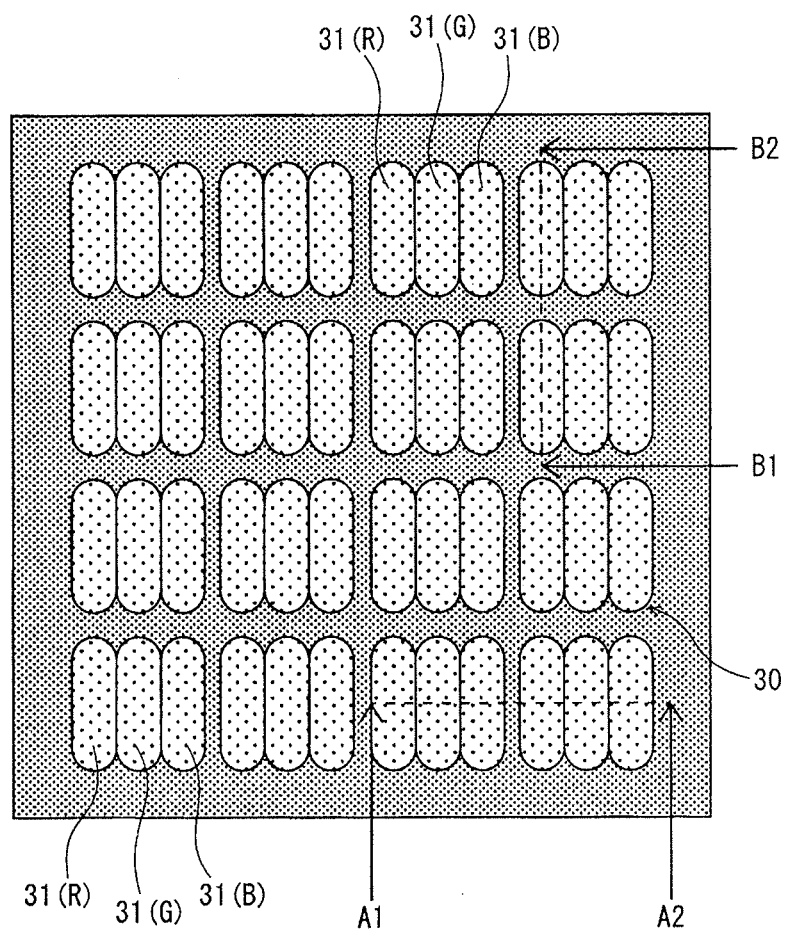
FIG. 2 is a plan view showing an EL substrate.
Figure 3:
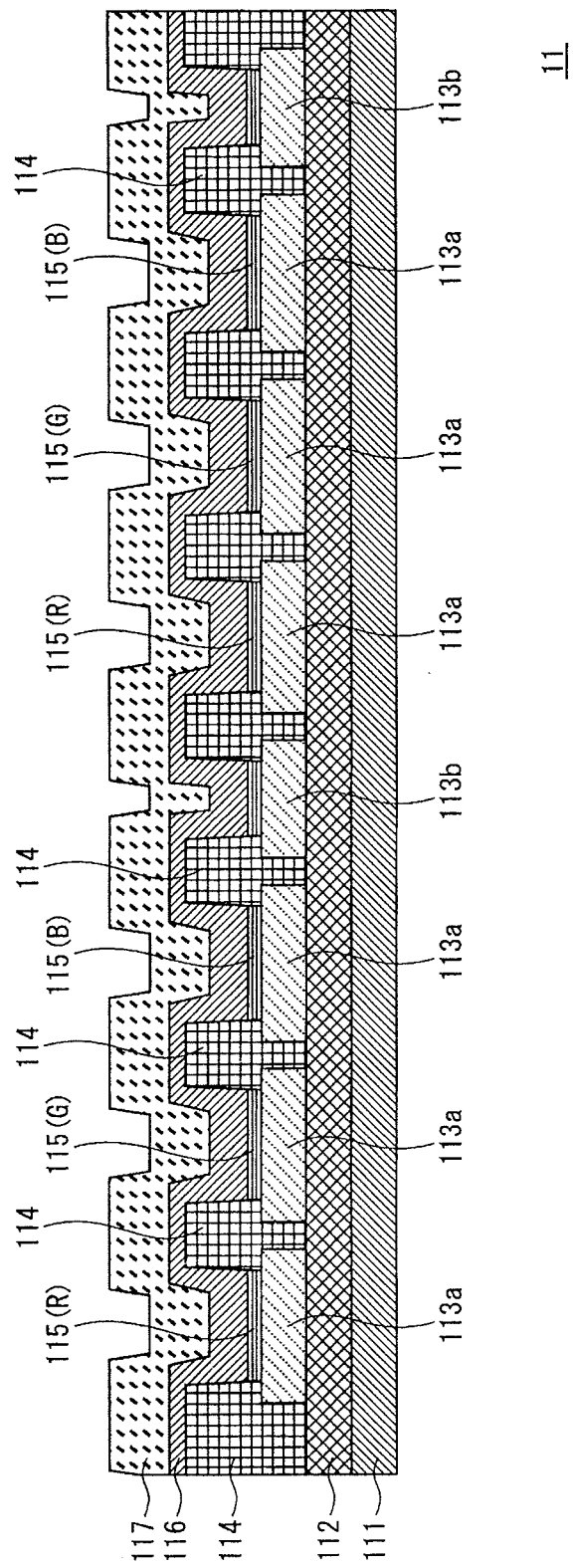
FIG. 3 is a cross-sectional view taken along the line A1-A2 of FIG. 2 and seen in the arrow direction.
Figure 4:
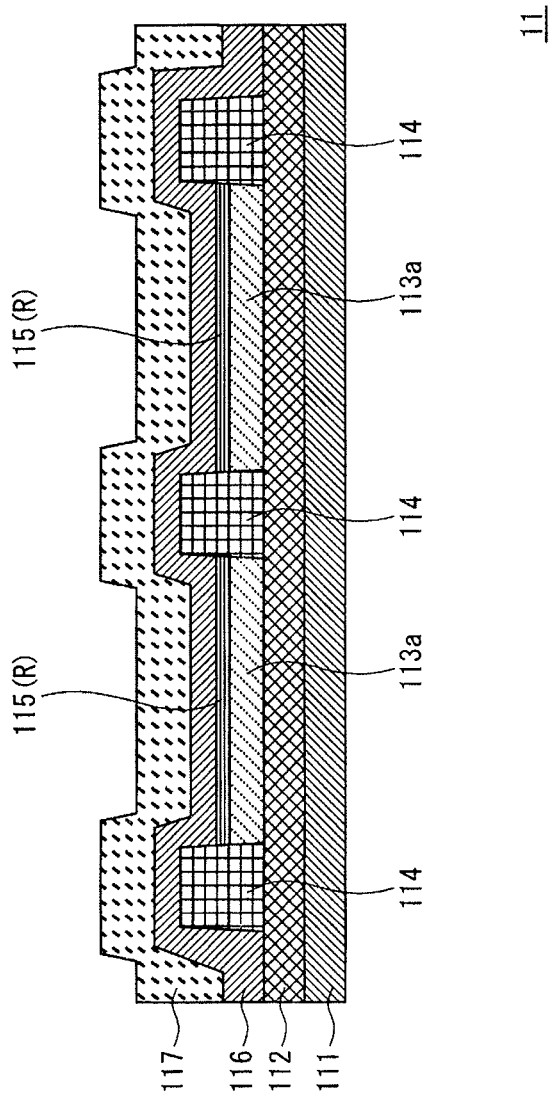
FIG. 4 is a cross-sectional view taken along the line B1-B2 of FIG. 2 and seen in the arrow direction.

FIG. 2 is a plan view showing the EL substrate 11. FIG. 3 is a cross-sectional view taken along the line A1-A2 of FIG. 2 and seen in the arrow direction. FIG. 4 is a cross-sectional view taken along the line B1-B2 of FIG. 2 and seen in the arrow direction.

It is assumed that the top or upper surface of the EL substrate 11 is the surface thereof to be joined to the CF substrate 12. In FIG. 1, the top or upper surface of the EL substrate 11 is shown at the lower side of FIG. 1, as compared to the other surface of the EL substrate 11.

A plurality of pixels 30 are disposed in rows on the substrate (111) of the EL substrate 11. In the present embodiment, each pixel 30 is composed of three light emitting elements of colors R, G, and B, namely, a light emitting element 31(R), a light emitting element 31(G), and a light emitting element 31(B). The reference sign 31 hereinafter denotes the light emitting elements in generality, without regard for the color emitted thereby. A display region refers to an region in which the pixels 30 are disposed in a matrix.

Each light emitting element 31 has an elongated shape. The three light emitting elements 31(R), 31(G), and 31(B) are aligned in the lateral direction thereof so as to form an approximate square when viewed in the plane (see FIG. 2).

The following descriptions primarily reference FIGS. 2 to 4.

A TFT substrate serves as the substrate 111. An interlayer insulation film 112 is formed on the upper surface of the TFT substrate 111.

An anode 113a is disposed, for each light emitting element 31, on the upper surface of the interlayer insulation film 112. Each of the anodes 113a has an elongated shape when viewed in the plane, similarly to the light emitting elements 31. As shown in FIGS. 3 and 4, auxiliary electrodes 113b are formed on the upper surface of the interlayer insulation film 112, in portions that are different from where the anodes 113a are formed and that are between the pixels 30.

A bank 114 is formed between any two adjacent anodes 113a, and between any anode 113a and the auxiliary electrode 113b adjacent thereto. Each bank 114 protrudes upward by extending from a region on the interlayer insulation film 112 where no anode 113a or auxiliary electrode 113b is formed and passing between two adjacent anodes 113a or between any anode 113a and the auxiliary electrode 113b adjacent thereto.

A light-emitting layer 115 emitting light of a predetermined color is layered on each anode 113a within an region defined by the banks 114 (i.e., surrounded by the banks 114). The light-emitting layer 115 is an organic light-emitting layer in the present example.

The predetermined color emitted from each light-emitting layer 115 is blue, green or red. However, the predetermined color may also be yellow or the like. In the drawings, the reference sign "115(B)" denotes a blue light-emitting layer, the reference sign "115(G)" denotes a green light-emitting layer, and the reference sign "115(R)" denotes a red light-emitting layer. The reference sign "115" denotes the organic light-emitting layers in generality, without regard for the color emitted thereby.

A cathode 116 and a sealing layer 117 are layered on the upper surface of the organic light-emitting layer 115 so as to traverse the regions defined by the banks 114 and be continuous with those layered on the upper surface of the adjacent organic light-emitting layers 115 and on the upper surface of the auxiliary electrodes 113b. The sealing layer 117 serves to prevent the organic light-emitting layers 115 and so on from being exposed to moisture and air.

(3) CF Substrate

Figure 5:
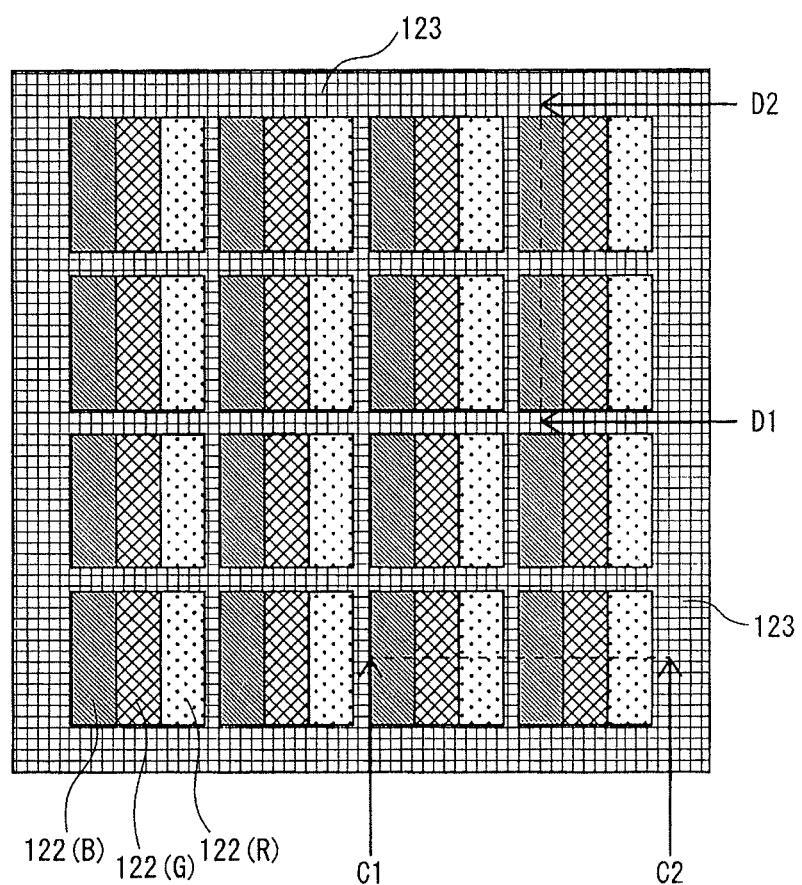
FIG. 5 is a plan view showing a CF substrate.
Figure 6:
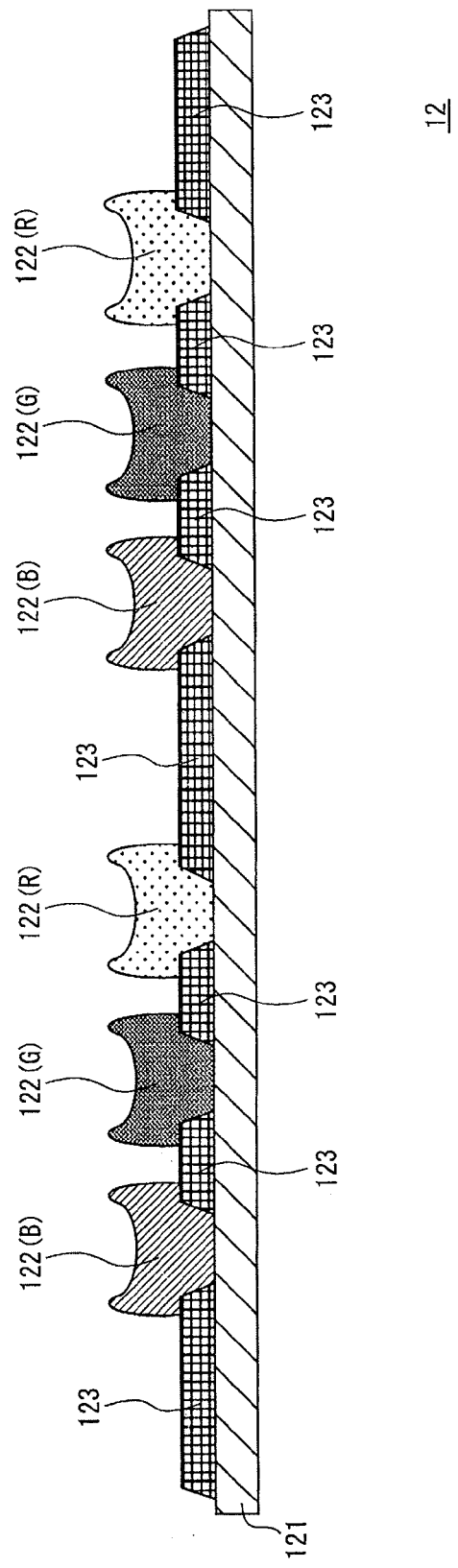
FIG. 6 is a cross-sectional view taken along the line C1-C2 of FIG. 5 and seen in the arrow direction.
Figure 7:
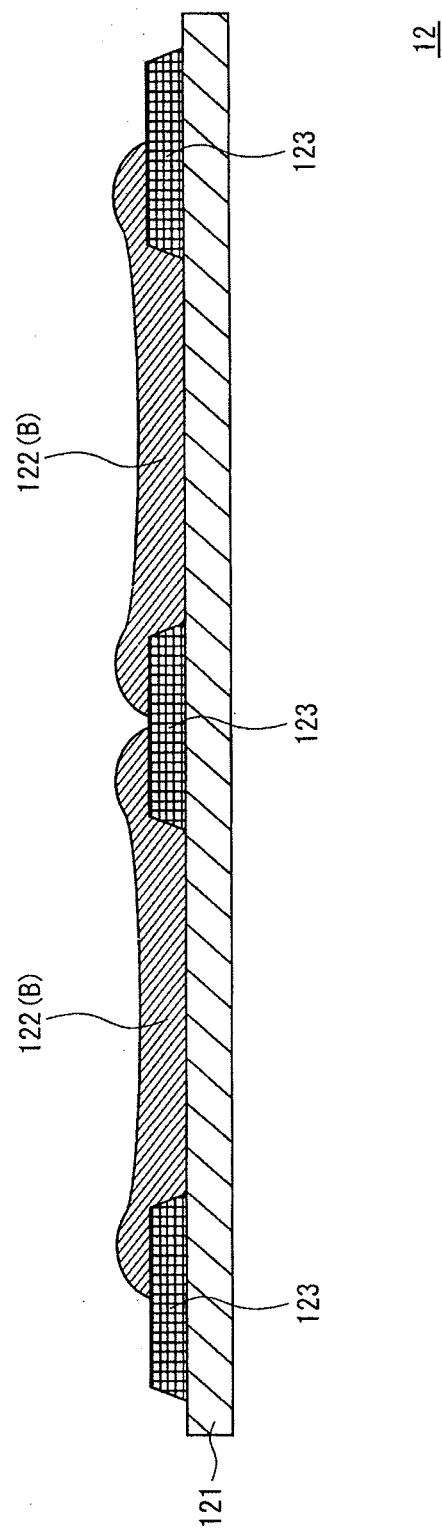
FIG. 7 is a cross-sectional view taken along the line D1-D2 of FIG. 5 and seen in the arrow direction.

FIG. 5 is a plan view showing the CF substrate 12. FIG. 6 is a cross-sectional view taken along the line C1-C2 of FIG. 5 and seen in the arrow direction. FIG. 7 is a cross-sectional view taken along the line D1-D2 of FIG. 5 and seen in the arrow direction.

It is assumed that the top or upper surface of the CF substrate 12 is to be joined to the EL substrate 11. In FIG. 1, the top or upper surface of the CF substrate 12 is shown at the upper side of FIG. 1, compared to the other surface of the CF substrate 12.

The CF substrate 12 includes a substrate 121, color filters 122, and so on.

As shown in FIG. 5, each of the color filters 122 has an elongated shape when viewed in the plane, similarly to the light emitting elements 31 shown in FIG. 2.

The following descriptions primarily reference FIGS. 6 and 7.

The substrate 121 is the front substrate of the display panel 10, and is made of a translucent material. Color filters 122(B), 122(G), and 122(R) are formed on the upper surface of the substrate 121, respectively corresponding to the organic light-emitting layers 115(B), 115(G), and 115(R) of the EL substrate 11. The reference sign "122" denotes the color filters in generality, without regard for the color thereof.

A so-called black matrix (hereinafter, simply "BM") 123 is formed on the upper surface of the substrate 121, between each of the color filters 122. As shown in FIGS. 6 and 7, each of the color filters 122 is formed to partially overlap the upper peripheral edge of the adjacent BM 123 to each side.

The BMs 123 are black layers provided for the purpose of preventing external light from reflecting on or entering the display surface of the display panel 10 so as to improve display contrast. As shown in FIG. 1, the BMs 123 are formed to correspond to (i.e., to oppose) the banks 114 of the EL substrate 11.

2. Manufacturing Method

One example of the manufacturing method of the display panel 10 includes: an EL preparation process of preparing the EL substrate 11; a CF preparation process of preparing the CF substrate 12 having a sealing member around a display region; and a bonding process of joining and bonding the EL substrate 11 and the CF substrate 12 thus prepared.

(1) EL Preparation Process

In the EL preparation process, the EL substrate 11 is prepared. Specifically, the light emitting elements 31 are formed on the TFT substrate 111. Since the light emitting elements 31 can be formed using the conventional technology, details of the descriptions are omitted.

(2) CF Process

One example of the CF preparation process includes: a CF formation step, which is a step of forming the color filters 122 on the substrate 121; an application step, which is a step of applying a paste including a sealing material to the substrate 121; and an integration step, which is a step of integrating the applied paste (to be precise, a sealing material contained in the paste) with the substrate 121.

The following describes the CF preparation process in detail, with reference to the drawings.

FIGS. 8A-1 to 8D-2 illustrate the CF process.

Figures 1, 8A:
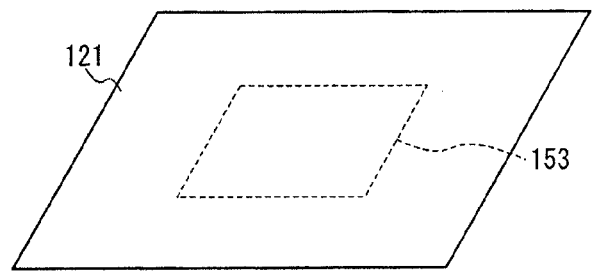
Figures 2, 8A:
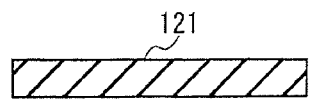
Figures 1, 8B:
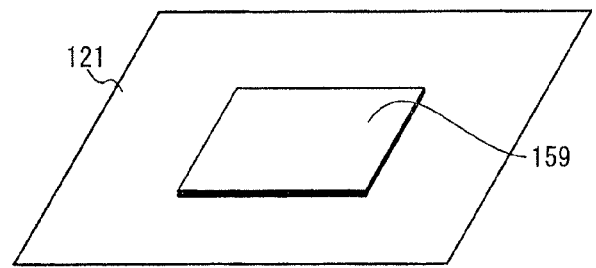
Figures 2, 8B:
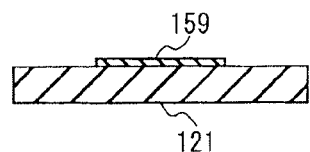
Figures 1, 8C:
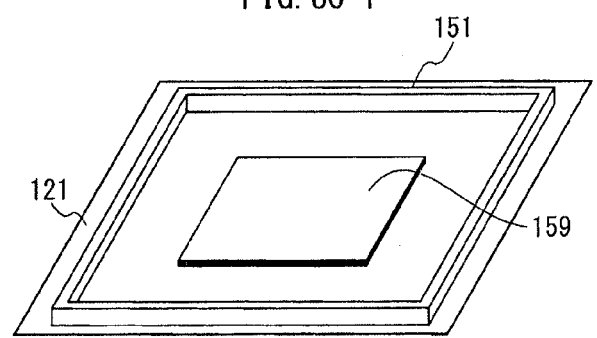
Figures 2, 8C:
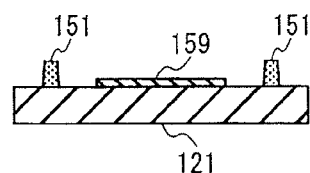
Figures 1, 8D:
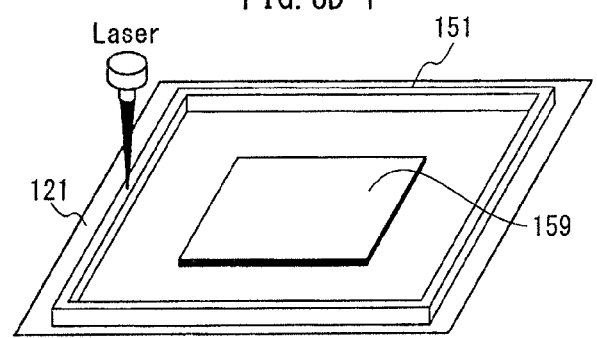
Figures 2, 8D:
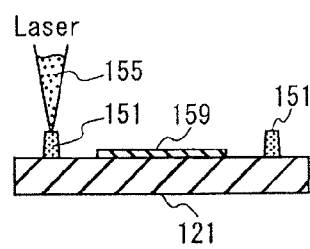

FIGS. 8A-1 to 8D-1 on the left are perspective views and FIGS. 8A-2 to 8D-2 on the right are cross-sectional views. Among these figures, each pair shown side-by-side is related to the same step.

In the present embodiment, frit glass is used as the sealing material, and a so-called frit paste is used as the paste. Hereinafter, descriptions are provided with the sealing member being frit glass and the paste being frit paste.

Note that the manufacturing method includes two different integration steps, i.e., a step of integrating the sealing material in the paste with the substrate 121 of the CF substrate, and a step of integrating the sealing material with the EL substrate. To distinguish these integration steps from each other, the step of integrating with the CF substrate is referred to as a frit integration step, and the step of integrating with the EL substrate is referred to as an EL integration step.

(a) CF Formation Step

FIGS. 8A-1 and 8A-2 show a CF formation step. As shown in the figures, the substrate 121 (corresponding to "first substrate" in the present disclosure), which is made of glass, is prepared. Then, as shown in FIGS. 8B-1 and 8B-2, the color filters 122 (hereinafter, also collectively referred to as "CF 159") are formed in a display region 153. Since the CF formation step is performed using the conventional technology, details of the descriptions are omitted. Note that the display region 153 of the glass substrate 121 corresponds to the region of the EL substrate 11 in which the light emitting elements 31 are formed.

(b) Application Step

FIGS. 8C-1 to 8C-2 show an application step. As shown in the figures, a frit paste 151 is applied to a portion of the glass substrate 121 which corresponds to a sealing portion.

The frit paste 151 is applied on the glass substrate 121 with use of a nozzle for ejecting the frit paste 151. Specifically, the nozzle is moved from a start position in the vicinity of the CF 159 to an end position along the display region 153, so as to apply the frit paste 151 in a frame pattern surrounding the CF 159 on the glass substrate 121.

The frit paste 151 is applied such that the center line of the frit paste 151 applied in an end region including the end position is substantially parallel to and separate from the center line of the frit paste 151 applied in a start region including the start position.

Here, the distance of separation between the center line of the frit paste 151 applied in the end region and the center line of the frit paste 151 applied in the start region is less than the width of the frit paste 151 applied in a region other than the start region and the end region. Hereinafter, this distance is referred to as "separation distance".

Hereinafter, regarding the frit paste 151 applied on the glass substrate 121, the frit paste applied in the start region including the start position is referred to as "start portion of the frit paste" or simply "start portion". Also, the frit paste applied in the end region including the end position is referred to as "end portion of the frit paste" or simply "end portion".

Also, the region other than the start region and the end region is referred to as "intermediate region", and the frit paste applied in this region is referred to as "intermediate portion of the frit paste" or simply "intermediate portion".

(c) Frit Integration Step

For example, the frit integration step includes a drying step and a baking step, which are performed in the stated order. In the drying step, a solvent, etc. included in the frit paste 151 is removed. Then, in the baking step, a binder, etc. included in the frit paste 151 is removed.

In the present example, the baking step is performed with use of a laser 155 as shown in FIGS. 8D-1 and 8D-2. In this way, along with the removal of the binder, etc, the frit glass (glass powder) included in the frit paste is melted and integrated with the glass substrate 121. Note that the frit glass baked and integrated with the glass substrate 121 is referred to as a sealing material 157.

Through the frit integration step, the deformable frit paste is changed to the frit glass not deformable at room temperature. In this way, for example, when the EL substrate 11 and the CF substrate 12 are joined, the height of the frit glass cannot be adjusted by pressing the EL substrate 11 and the CF substrate 12 at room temperature (the room temperature being a state where the frit glass is not melted).

(3) Bonding Process

One example of the bonding process includes: a sealant application step, which is a step of applying a sealant 161 to the CF substrate 12; a resin material application step, which is a step of applying a resin material 163 for the sealing layer 117 to the CF 159 of the CF substrate 12; a joining step, which is a step of joining the CF substrate 12, to which the sealant 161 and the resin material 163 are applied, and the EL substrate 11 under reduced pressure; a resin curing step, which is a step of curing the resin material; and an EL integration step, which is a step of integrating the EL substrate 11 and the sealing material 157. After the joining under reduced pressure is completed, the resin material may be cured under atmospheric pressure or under reduced pressure.

The following describes the bonding process in detail, with reference to the drawings.

FIGS. 9A-1 to 9D-2 illustrate the bonding process.

Specifically, FIGS. 9A-1 to 9D-2 illustrate the joining step and the steps thereafter in the bonding process. Similarly to FIGS. 8A-1 to 8D-2, FIGS. 9A-1 to 9D-1 on the left are perspective views and FIGS. 9A-2 to 9D-2 on the right are cross-sectional views. Among these figures, each pair shown side-by-side is related to the same step.

(a) Application Step

In the sealant application step, sealants 161a and 161b are applied along the sealing material 157, which is formed in a rectangular frame pattern in a plan view. The sealants 161a and 161b are applied outside and inside the sealing material 157. The outer sealant 161a mainly serves to prevent moisture, oxygen, etc. from entering the light emitting elements 31 from outside, during the resin curing step and the EL integration step. The inner sealant 161b mainly serves to prevent the resin material 163 for the sealing layer from entering between the sealing material 157 before baking and the EL substrate 11, and causing the defective adhesion therebetween. Also, the inner sealant 161b serves to separate the resin material 163 and the sealing material 157 from each other, so that the resin material 163 does not deteriorate by heat during baking of the sealing material 157 in the EL integration step.

The sealants 161a and 161b may be epoxy resin, acrylic resin, silicone resin, etc., for example.

In the resin material application step, the resin material 163 is dripped onto the CF 159. The resin material 163 is dripped with uniform distribution.

FIGS. 9A-1 and 9A-2 show the CF substrate 12 after completion of the sealant application step and the resin material application step.

(b) Pressure Reducing Step

The pressure reducing step is performed to reduce pressure, immediately before joining of the EL substrate 11 and the CF substrate 12. This makes it possible to avoid intake of air bubbles into the resin material 163 during the joining step performed next. It is also possible to remove a gas existing at the interface between the sealant 161 and the CF substrate 12, a gas generated during baking of the frit paste 151, and so on.

(c) Joining Step

As shown in FIGS. 9B-1 and 9B-2, in the joining step, the CF substrate 12 after the application step and the EL substrate 11 prepared in the EL preparation process are joined under reduced pressure, such that an element region of the EL substrate 11 and the CF 159 of the CF substrate 12 face each other. In this joining step, a differential pressure generated when the pressure is brought back to atmospheric pressure is used so as to uniform the thickness of the resin material 163.

(d) Resin Curing Step

In the resin curing step, the resin material 163 between the EL substrate 11 and the CF substrate 12 is cured. As shown in FIGS. 9C-1 and 9C-2, curing of the resin material 163 in the present example is achieved by a polymerization reaction between the resin material 163 and the sealants 161a and 161b, with use of heat and ultraviolet rays. The resin material 163 and the sealants 161a and 161b after curing are denoted as a sealing resin 163' and sealants 161a' and 161b', respectively.

(e) EL Integration Step

In the EL integration step, the sealing material (i.e., frit glass) 157 is melted to be integrated with the EL substrate 11. Specifically, the integration is performed by baking the sealing material 157 with use of a laser 167, as shown in FIGS. 9D-1 and 9D-2.

The sealing material 157 that has been baked and integrated with the EL substrate 11, and that is thus in a state of sealing the display region 153, is referred to as a "sealing member".

3. Application Step (Frit Paste)

The following describes the application step in detail.

(1) Dispenser Device

The frit paste 151 is applied to the glass substrate 121 with use of a dispenser device. The dispenser device has a nozzle and ejects the frit paste 151 from the nozzle.

Figure 10A:
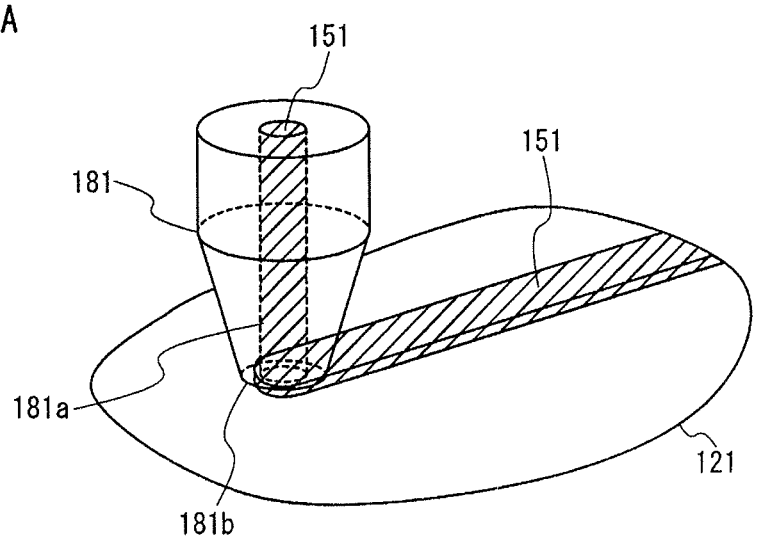
FIGS. 10A to 10C illustrate application of a frit paste using a nozzle, where
Figure 10B:
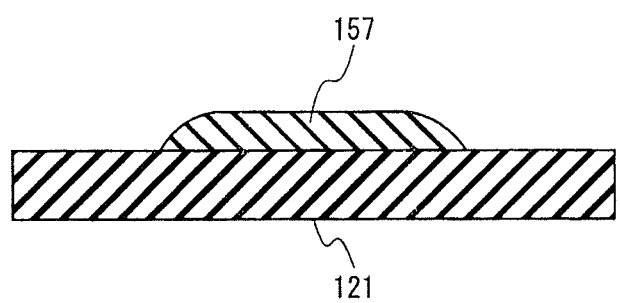
Figure 10C:
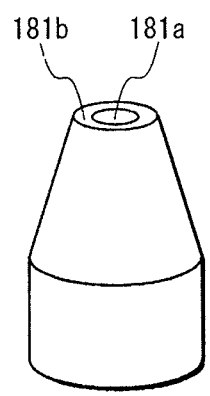

FIG. 10A is a perspective view showing the nozzle applying the frit paste 151. In FIG. 10A, the frit paste 151 is hatched to show the state of the frit paste 151. FIG. 10B is a sectional view showing the frit paste 151 applied on the glass substrate 121. FIG. 10C is a perspective view showing the nozzle upside down, so that the lower end surface is shown upward.

The dispenser device has a cylinder for storing the frit paste 151 therein, and a nozzle 181 provided at the bottom edge of the cylinder. The nozzle 181 is communicated with a cylinder chamber within the cylinder. When a pressure is applied within the cylinder chamber, the frit paste 151 is ejected from an outlet 181a.

When the nozzle 181 is brought close to the glass substrate 121 to a certain degree, the frit paste 151 is ejected such that the gap between the glass substrate 121 and an end surface 181b of the nozzle 181 around the outlet 181a is filled with the frit paste 151. At this point, the height of the frit paste 151 is defined by the end surface 181b of the nozzle 181.

In the present embodiment, the distance between the glass substrate 121 and the nozzle 181 is controlled by a displacement gauge (e.g., a laser interferometric displacement gauge) provided in the vicinity of the nozzle 181. This allows the height of the frit paste 151 applied on the glass substrate 121 to be uniform.

Also, when an ejection pressure for the frit paste 151 to be ejected from the outlet 181a is increased, the frit paste 151 is pushed through the outlet 181a toward the outer periphery thereof. In other words, let the end surface 181b of the nozzle 181 be a surface opposing the glass substrate 121. In this case, increasing the ejection pressure applied to the frit paste 151 causes the frit paste 151 to be pushed toward the end surface 181b of the nozzle 181. This enables the outlet 181a for the frit paste 151 to produce the same effect as an outlet larger than the outlet 181a. As a result, the width of the ejected frit paste 151 is increased. In short, the width of the frit paste 151 applied on the glass substrate 121 changes depending on the ejection pressure for the frit paste 151 to be ejected from the nozzle 181.

There is a case where the frit paste 151 is applied in a state where the frit paste 151 is pushed beyond the end surface 181b of the nozzle 181 toward the side surface of the nozzle 181. The frit paste 151 may be applied in such a state as described above; however, it is more beneficial that the width of the end surface of the nozzle 181 is larger than the intended width of the frit paste. In this way, the height of the frit paste can be made uniform more reliably.

(2) Start Portion and End Portion

FIGS. 11A and 11B show the frit paste applied on the glass substrate 121, where FIG. 11A is a magnified view showing the start portion, and FIG. 11B is a magnified view showing the start portion and the end portion.

FIGS. 12A-1 to 12F-2 show the state of application of the frit paste.

FIGS. 12A-1 and 12B-1 are cross-sectional views showing that the frit paste is applied in the start region. FIG. 12C-1 is a cross-sectional view showing that the frit paste is applied in the intermediate region. FIGS. 12D-1, 12E-1, and 12F-1 are cross-sectional views showing that the frit paste is applied in the end region.

FIGS. 12A-2 and 12B-2 are plan views showing the frit paste applied in the start region. FIG. 12C-2 is a plan view showing the frit paste applied in the intermediate region. FIGS. 12D-2, 12E-2, and 12F-2 are plan views showing the frit paste applied in the end region.

In practice, the frit paste 151 is ejected (applied) such that the end portion and the start portion overlap each other. However, in order to explain how the frit paste 151 is applied in the start region and the end region, the start portion and the end portion do not overlap in the figures.

Figure 13:
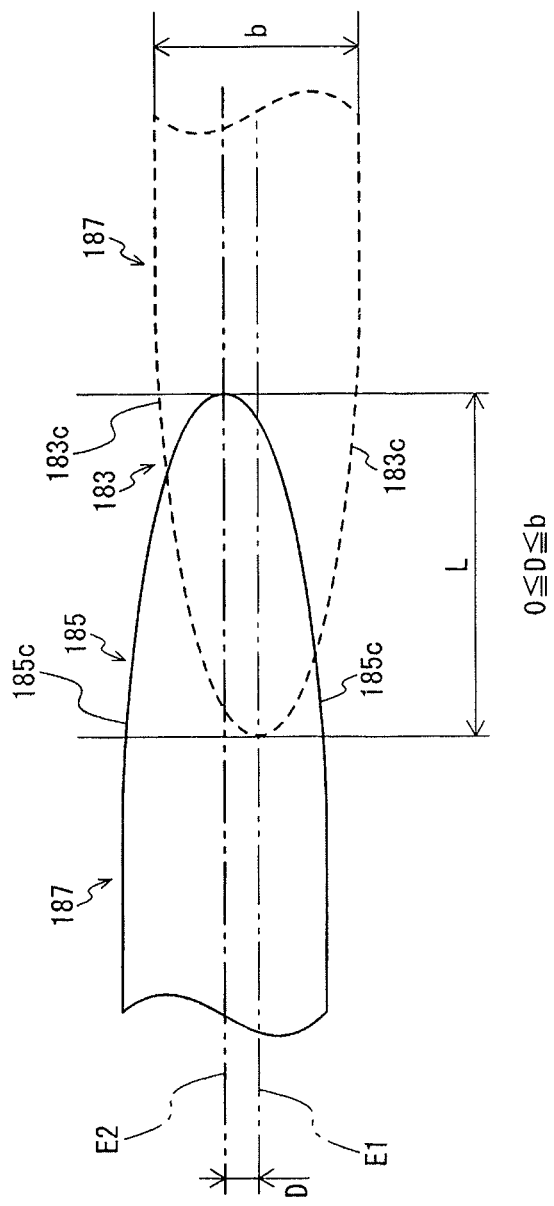
FIG. 13 is a plan view showing the center line of the start portion that has been applied, and the center line of the end portion that has been applied.

FIG. 13 is a plan view showing the center line of the start portion that has been applied, and the center line of the end portion that has been applied.

In FIG. 13, the start portion and the end portion are denoted by the reference signs "183" and "185", respectively. Also, the start portion 183 is shown by a dashed line, and the end portion 185 is shown by a thick solid line. For the convenience of drawing, the overlapping state of the start portion 183 and the end portion 185 in FIG. 13 is different from an actual overlapping state thereof in a plan view.

In FIGS. 11A and 11B, the start portion of the frit paste 151, which is a portion applied in the start region of the glass substrate 121, is denoted by the reference sign "183". The end portion of the frit paste 151, which is a portion applied in the end region of the glass substrate 121, is denoted by the reference sign "185". The intermediate portion of the frit paste 151, which is a portion applied in a region other than the start and end regions, is denoted by the reference sign "187". Hereinafter, the portion of the frit paste 151 including the start portion and the end portion may also be referred to as "connected portion".

Also, the start edge and end edge of the frit paste 151 means the start and end of application, which also indicates the passage of time during the application. Accordingly, based on the passage of time, each of the start portion 183 and the end portion 185 may be divided into two portions, i.e., "initial part" and "final part" or divided into two stages, i.e., "initial stage" and "final stage".

Note that the initial part of the start portion 183 corresponds to "the paste applied in part of the start region, the part being located closer to the start position than other part of the start region" in the present disclosure. Also, the start edge of the initial part of the start portion 183, i.e., the start edge of the start portion 183, corresponds to "the start edge of the paste applied in the start region". Also, the final part of the end portion 185 corresponds to "the paste applied in part of the end region, the part being located closer to the end position than other part of the end region". Also, the end edge of the final part of the end portion 185, i.e., the end edge of the end portion 185, corresponds to "the end edge of the paste applied in the end region" of the present disclosure.

Here, it has been observed that the thickness of the frit paste 151 is locally increased if the frit paste 151 is applied such that the center line of the end portion 185 and the center line of the start portion 183 overlap. Also, it has been learned that even when the volume of frit paste 151 ejected from the nozzle 181 is controlled to be gradually decreased during formation of the end portion 185, the frit paste 151 is still locally increased due to the volume of the frit paste 151 ejected unexpectedly from the nozzle 181 (outlet 181a).

Accordingly, a study has been conducted to find the cause of unexpected ejection of the frit paste 151 from the outlet 181a even under the control of gradually decreasing the volume of the frit paste 151. As a result, it has been found that the frit paste 151 filled within the outlet 181a is pulled by the frit paste 151 outside the outlet 181a, and thereby ejected outside the nozzle 181.

In other words, suppose that the nozzle 181 is lifted in a state where the frit paste 151 ejected from the outlet 181a is connected to the start portion 183 of the frit paste 151 that has already been applied. In this case, the frit paste 151 around and within the outlet 181a is integrated with the start portion 183 and the end portion 185 of the frit paste 151 located outside the outlet 181a, and therefore is subjected to the tensile stress acting in an outside direction. As a result, the frit paste 151 around and within the outlet 181a is ejected outside similarly to the case where the ejection pressure is applied to the frit paste 151. That is, when forming the end portion 185, the frit paste 151 at the nozzle 181 and within the outlet 181a is continuously pulled out and ejected from the nozzle 181. As a result, the frit paste 151 is thickly applied on the start portion 183 that has already been applied, resulting in the frit paste 151 being locally non-uniform in thickness.

Accordingly, the following study has been conducted in order to reduce the tensile stress acting on the frit paste 151 within the nozzle 181 during the formation of the end portion 185 of the frit paste 151.

(2-1) Start Portion

In the start region, the nozzle 181 is moved with an ejection pressure being applied thereto, while a predetermined distance between the glass substrate 121 and the nozzle 181 is maintained. In this way, the volume of the frit paste 151 ejected from the nozzle 181 is gradually increased and stabilized at a constant volume. This is because the frit paste 151 is a thixotropic non-Newtonian fluid, and there is a time delay before the viscoelasticity of the frit paste 151 within the nozzle 181 is stabilized at a constant value.

Accordingly, as shown in FIG. 11A, FIG. 12B-2, and FIG. 13, the entirety of the start portion 183 has a triangular shape in a plan view, where the width of the frit paste 151 (i.e., the dimension perpendicular to the center line of the frit paste 151 that has been applied) gradually decreases from a final part 183b to an initial part 183a (from right to left in FIG. 13). Note that an edge of the start portion 183 shown on the left side of FIG. 13 is the start edge.

As shown in FIG. 11A and FIG. 12A-1, the ejected volume of the frit paste 151 is small in the initial stage (i.e., stage in which the initial part 183a is applied). Accordingly, the initial part 183a of the frit paste 151 applied in the initial stage has a small width and a small height.

As shown in FIG. 11A and FIG. 12B-2, the volume of the frit paste 151 ejected from the nozzle 181 is increased in the final stage (i.e., stage in which the final part 183b is applied) as compared to the initial stage, and the top of the ejected frit paste 151 makes contact with the end surface 181b of the nozzle 181 to be planarized. In other words, the top surface of the final part 183b is a planarized surface 184 that has been planarized. Note that the final part 183b is a portion that has the planarized surface 184, and at which the width of the frit paste 151 reaches a constant value.

Note that by gradually increasing the ejection pressure (i.e., reducing the rate of increasing the ejection pressure), the triangular shaped portion can be elongated.

By applying the frit paste 151 as described above, the start portion 183 is obtained that has a triangular shape in a plan view, and that has a width increasing from the initial part 183a to the final part 183b, as shown in FIG. 12B-2.

In other words, the start portion 183 has an inclined side face 183c which, in a plan view (FIG. 13), is inclined toward a center line E1 of the start portion 183, in a direction approaching the start edge of the start portion 183 from the intermediate portion 187.

Note that the side face described herein is a face of the start portion 183 viewed from a lateral direction (i.e., direction that is parallel to the surface of the glass substrate 121 to which the frit paste 151 is applied, and that is perpendicular to the frit paste 151 that has been applied). The side face may be a linear flat face or a curved face (e.g., an arc face).

As shown in FIG. 13, the center of the start portion 183 is located within the end portion 185 or part of the intermediate portion 187 adjacent to the end portion 185. At least part of the start portion 183 overlaps the end portion 185. In other words, the frit paste 151 is applied in the end region so as to partially overlap the start portion 183.

Also, the center of the start portion 183 and the center of the end portion 185 are separate from each other.

(2-2) Intermediate Portion

As shown in FIGS. 11A and 11B, and FIG. 12C-2, the ejected volume of the frit paste 151 is constant in the intermediate portion 187. In the intermediate portion 187, the width of the top planarized surface 184 of the frit paste 151 is constant and the height of the frit paste 151 is also constant.

(2-3) End Portion

In the end region, the nozzle 181 is moved with a valve for applying an ejection pressure being closed, while a predetermined distance between the glass substrate 121 and the nozzle 181 is maintained. In this way, the volume of the frit paste 151 ejected from the nozzle 181 is gradually decreased and the ejection of the frit paste 151 is eventually ended. This is because the frit paste 151 is a thixotropic non-Newtonian fluid, and there is a time delay from the closure of the valve to stop application of the pressure until the viscoelasticity of the frit paste 151 within the nozzle 181 is stabilized at a certain value.

Accordingly, as shown in FIG. 11B, FIG. 12D-2 to 12F-2, and FIG. 13, the entirety of the end portion 185 has a triangular shape in a plan view, where the width of the frit paste 151 (i.e., the dimension perpendicular to the center line of the frit paste 151 that has been applied) gradually decreases from an initial part 185a to a final part 185b (from left to right in FIG. 13). Note that an edge of the end portion 185 shown on the right side of FIG. 13 is the final edge.

As shown in FIG. 11B and FIGS. 12D-1 and 12D-2, the initial stage (i.e., stage in which the initial part 185a is applied) is a stage immediately after the transition from the intermediate region (intermediate portion 187) to the end region, and the ejected volume of the frit paste 151 gradually decreases in the initial stage. Accordingly, the initial part 185a of the frit paste 151 applied in the initial stage has a large width and a large height.

As shown in FIG. 11B and FIG. 12E-2, in the final stage (i.e., stage in which the final part 185b is applied), the volume of the frit paste 151 ejected from the nozzle 181 is small as compared in the initial stage. Also, the top of the ejected frit paste 151 separates from the end surface 181b of the nozzle 181, and the height of the frit paste 151 gradually decreases. Eventually, as shown in FIG. 12F-2, the frit paste 151 stops being ejected from the nozzle 181, the application of the end portion 185 is completed, and the application step of the frit paste 151 to the glass substrate 121 is also completed.

Note that by gradually decreasing the ejection pressure, the triangular shape of the end portion 185 can be elongated.

By applying the frit paste 151 as described above, the end portion 185 is obtained that has a triangular shape in a plan view, and that has a width decreasing from the initial part 185a to the final part 185b. In other words, the end portion 185 has an inclined side face 185c which, in a plan view, is inclined toward a center line E2 of the end portion 185, in a direction approaching the end edge of the end portion 185 from the intermediate portion 187.

As shown in FIG. 13, the end edge of the end portion 185 is located within the start portion 183 or part of the intermediate portion 187 adjacent to the start portion 183.

Note that descriptions provided here pertain to: the ejected volume of the frit paste 151 in the end region; the shape of the applied frit paste 151; and so on. However, in practice, the shape of the end portion 185 is unlikely to be a triangle having two sides of equal length, such as the isosceles triangle shown in FIG. 13, since the frit paste 151 in the end region is applied so as to partially overlap the start portion 183.

(2-4) Application of Start and End Portions

The following describes application of the frit paste 151 in the end region, with reference to FIG. 13.

As shown in FIG. 13, the movement of the nozzle 181 during application in the end region (the movement coinciding with the path of the center of the outlet 181a of the nozzle 181 and also with the center line E2) is parallel to and slightly separate from the center line E1 of the start portion 183 (the center line E1 also coinciding with the path of the center of the outlet 181a of the nozzle 181). Note that a separation distance D between the center line E1 and the center line E2 is less than half a width b of the intermediate portion 187.

Figure 14A:
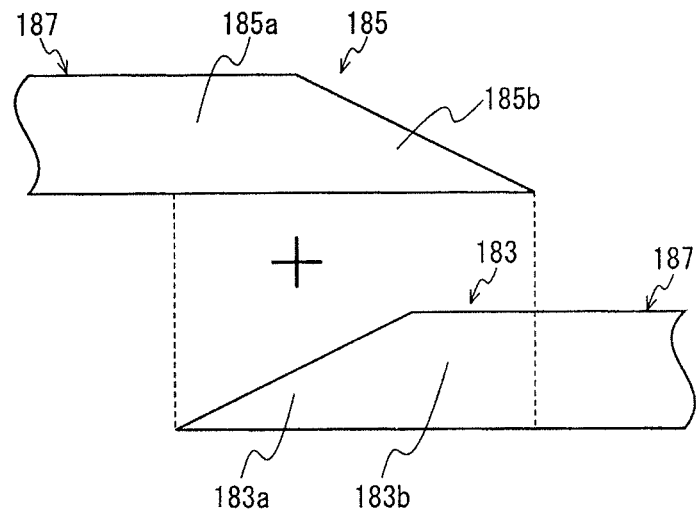
FIGS. 14A to 14C are each a longitudinal cross-sectional view illustrating application of the end portion.
Figure 14B:
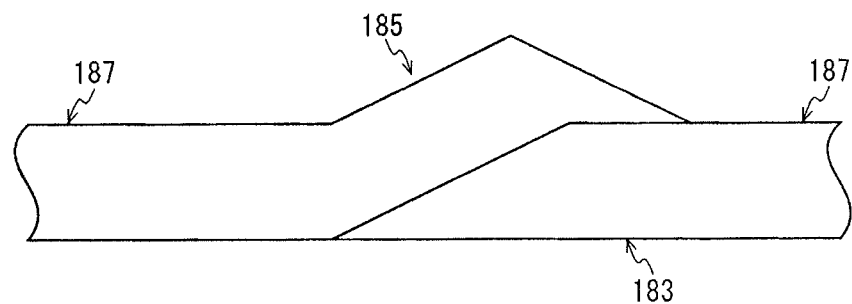
Figure 14C:
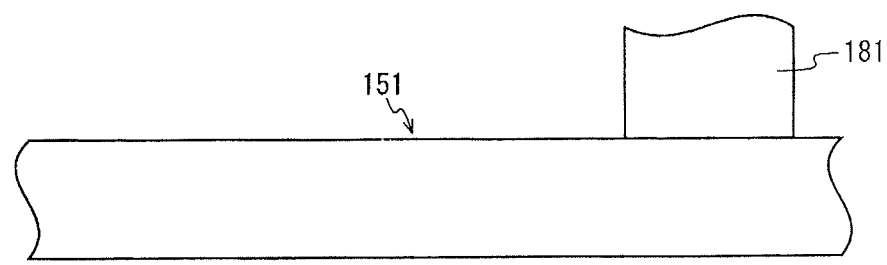

FIGS. 14A to 14C are each a longitudinal cross-sectional view for explaining the application in the end region.

FIG. 14A shows the respective shapes of the start portion 183 and the end portion 185 when the start portion 183 and the end portion 185 are applied separately from each other. In the application step, the end portion 185 is applied on the start portion 183. That is, the start portion 183 and the end portion 185 shown in FIG. 14A are applied so as to overlap each other.

FIG. 14B shows a state where the end portion 185 simply overlaps the start portion 183. The overlap portion is greater in height than the intermediate portion 187. In practice, the applied frit paste 151 may spread in the width direction thereof since the center line of the start portion 183 is separate from the center line of the end portion 185. However, when the end portion 185 is formed on the start portion 183 that have already been formed, the frit paste 151 is not easily ejected from the outlet 181a, causing the frit paste 151 to be less likely to spread. As a result, the height of the overlap portion at which the end portion 185 and the start portion 183 overlap is substantially equal to the distance between the nozzle 181 and the substrate.

That is, in an actual process, the start portion 183 already applied in the vicinity of the outlet 181a of the nozzle 181 serves as a resistance to the ejection of the frit paste 151 from the outlet 181a, resulting in the ejected volume being decreased. Also, while the frit paste 151 is ejected from the nozzle 181, the height of the frit paste 151 is adjusted by the end surface 181b of the nozzle 181.

Accordingly, as shown in FIG. 14C, the frit paste 151 filled between the nozzle 181 and the glass substrate 121 spreads in the width direction of the frit paste 151. After the nozzle 181 has passed, the height of the overlap portion at which the start portion 183 and the end portion 185 overlap coincides with the height of the intermediate portion 187.

4. Start Portion and End Portion (1) Separation Distance Between Center Line of Start Portion and Center Line of End Portion FIG. 15 is a planar schematic diagram illustrating the ejected frit paste and the separation distance between the center line of the start portion and the center line of the end portion.

In the following description using FIG. 15, b denotes the width of each of the end portion and the start portion in a region where the width of the frit paste is constant, and a denotes the diameter of the outlet 181a (indicated by the circle at the center of the nozzle 181 in FIG. 15) of the nozzle 181 used for ejection of the frit paste.

Figure 15:
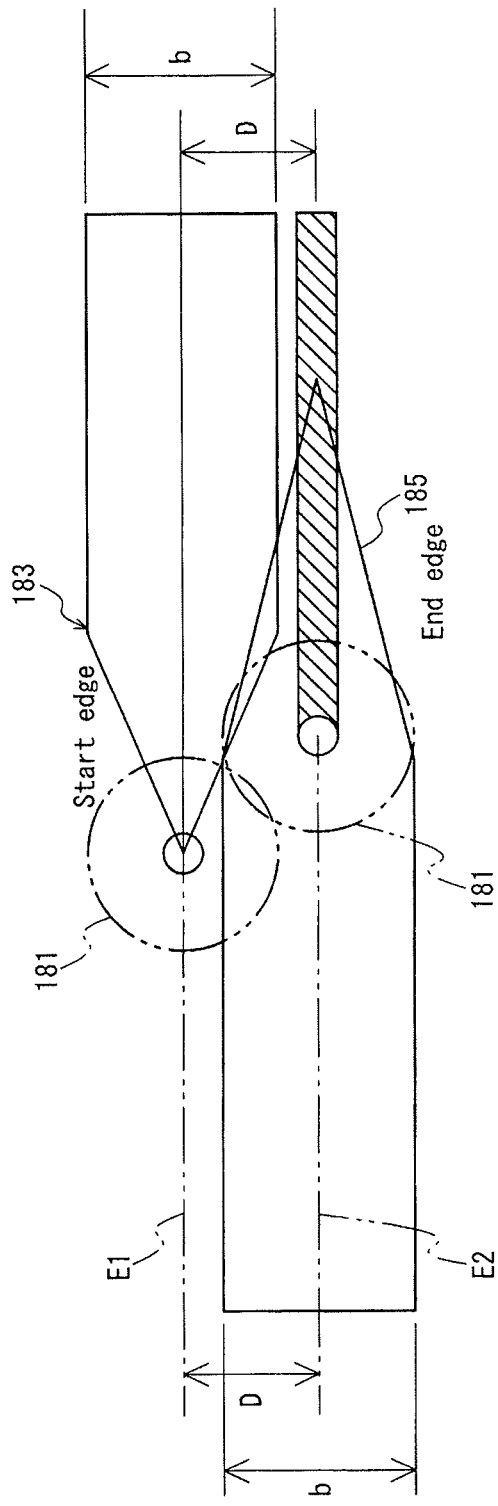
FIG. 15 illustrates application of the end portion.

As shown in FIG. 15, the center line E2 of the frit paste in the end region is separate from the center line E1 of the frit paste in the start region. Also, the separation distance between the center line E2 of the frit paste in the end region and the center line E1 of the frit paste in the start region is less than the width b of the frit paste applied in a region other than the start region and the end region (to be precise, less than half the combined width of the frit paste applied in the start region and the frit paste applied in the end region).

Also, the separation distance between the center lines E1 and E2 is greater than half the width b of the frit paste applied in the region other than the start region and the end region.

In this way, when the edge of the end portion is formed, the frit paste 151 in the outlet 181a is suppressed from being pulled out unintentionally. Also, the width of the frame of the display panel can be reduced as compared to when the end portion and the start portion are applied so as to be parallel to each other (i.e., when the end portion and the start portion are applied so as not to overlap each other). Furthermore, a side face of the start portion makes contact with a side face of the end portion more securely as compared to when the end portion and the start portion are applied such that a side face of the start portion opposes a side face of the end portion (i.e., when a gap exists between the side face of the start portion and the side face of the end portion), thus enabling improvement of sealing properties.

If the frit paste is applied such that the center line of the start portion coincides with the center line of the end portion, the entirety of the outlet of the nozzle passes over the start portion. As a result, a tensile stress tending to pull the frit paste out of the outlet of the nozzle is created between the start portion of the frit paste and the frit paste whose one end is out of the outlet and placed on the start portion.

On the other hand, as shown in FIG. 15, forming the start portion 183 and the end portion 185 so as to separate the center line E1 of the start portion 183 and the center line E2 of the end portion 185 from each other allows for reduction of the area over the start portion 183 in which the outlet 181a passes during formation of the end portion 185 (i.e., the area indicated by hatching in FIG. 15). This reduces a stress acting on the frit paste 151 within the outlet 181a as compared to conventional methods, thus preventing an increase in the thickness of the end portion 185 of the frit paste 151.

Note that FIG. 15 shows a state where the path of the outlet 181a at the edge of the end portion 185 does not overlap the start portion 183 of the frit paste 151. In other words, the separation distance D between the center line E1 of the start portion 183 and the center line E2 of the end portion 185 is greater than (a+b)/2.

However, the path of the outlet 181a (the area indicated by hatching in FIG. 15) during formation of the end portion 185 may partially but not completely overlap the start portion 183 of the frit paste 151.

For example, as shown in FIG. 15, it is acceptable as long as the separation distance D between the center line E1 of the start portion 183 and the center line E2 of the end portion 185 is greater than (b−2a)/2. It is more desirable that the separation distance D is greater than half the width b of the start portion 183, i.e., b/2.

In the above example, the width of the start portion 183 is equal to the width of the end portion 185. However, the width of the start portion 183 may be different from the width of the end portion 185. In this case, regardless of whether the start portion 183 or the end portion 185 has the larger width, it is acceptable as long as the separation distance D between the center lines is greater than (c−2a)/2, where the width of the start portion 183 denotes c. Furthermore, it is more desirable that the separation distance D of the center lines is greater than half the width c of the start portion 183.

Also, it is possible to reduce the stress acting on the interface between the frit glass formed by baking the frit paste 151 and the glass substrate 121, with use of the separation distance between the center line E1 of the start portion 183 of the frit paste 151 and the center line E2 of the end portion 185 of the frit paste 151.

Suppose that the start edge of the frit paste applied in the start region protrudes from the frit paste applied in the end region, or that the end edge of the frit paste applied in the end region protrudes from the frit paste applied in the start region. In either case, the frit glass melted during baking of the frit paste contracts to cause a stress between the start edge of the frit glass after baking (the start edge corresponding to the start edge of the frit paste) and the glass substrate or between the end edge of the frit glass after baking (the end edge corresponding to the end edge of the frit paste) and the glass substrate.

As a result, distortion may occur at part of the glass substrate to which the start edge or the end edge of the frit glass is connected (i.e., fused). If distortion occurs, a crack may occur from the start edge or end edge of the frit glass on the glass substrate, when the display panel is cut off from a large substrate obtained by joining a first large substrate on which a plurality of EL substrates are formed to a second large substrate on which a plurality of CF substrates are formed.

Accordingly, at least one (both in the present embodiment) of the start edge of the start portion 183 and the end edge of the end portion 185 is arranged within the applied frit paste, so as to reduce the stress acting on the interface between the frit glass and the glass substrate 121.

For example, when d denotes the width of the end portion and c denotes the width of the start portion, the separation distance D between the center line of the start portion of the frit paste and the center line of the end portion of the frit paste is greater than (c−2a)/2, and is equal to or less than half the width of one of the start portion and the end portion that has the smaller width (i.e., equal to or less than c/2, or, equal to or less than d/2). This makes it possible to prevent an increase in the thickness of the end portion. Furthermore, it is possible to reduce the stress acting on the interface between the frit glass and the glass substrate 121 by arranging the edge of the end portion on the start portion. The same applies to the start portion.

Needless to say, the width may be b=d, b=c, and/or c=d.

(2) Shapes of Start Portion and End Portion

Figure 17A:
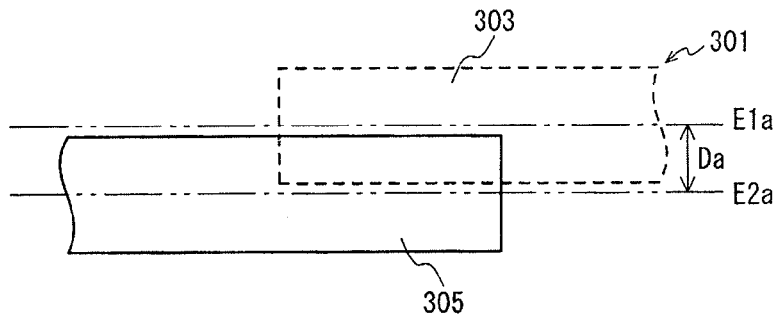
FIGS. 17A to 17E show the shapes of the applied frit paste according to Modifications.

As shown in FIG. 17A, the start portion and the end portion may be rectangular. However, it is more desirable that the start portion and the end portion are tapered, as shown in FIGS. 17D and 17E. By the start portion being tapered as shown in FIGS. 17D and 17E, a region in which the outlet 181a of the nozzle 181 overlaps the start region can be reduced when the frit paste is applied in the end region.

As shown in FIG. 17A, in the case where the start portion and the end portion are rectangular, a stress is applied to the interface between the glass paste and the glass substrate at the corners of the rectangular portions. When the start portion and the end portion are tapered, the angles at the side faces thereof are obtuse. As a result, a stress acting on the interface between the glass paste and the glass substrate can be reduced.

(3) Side Face

A side face of the start portion 183 and a side face of the end portion 185 are assumed to be the inclined side face 183c and the inclined side face 185c which, in a plan view, are inclined toward the respective center lines of the start portion 183 and the end portion 185. By overlapping the inclined side faces 183c and 185c of the start portion 183 and the end portion 185, the width of the frame of the display panel can be reduced.

Also, the width of the start portion 183 increases toward the end edge of the end portion 185 (i.e., as the width of the end portion decreases). Accordingly, the width of the overlap portion at which the start portion 183 and the end portion 185 overlap can be easily set to be constant.

5. Other (1) Frit Integration Step

In the frit integration step, the frit glass in the frit paste 151 is welded to the glass substrate 121 with use of the laser 155. However, it is possible to use another welding method. For example, the glass substrate 121 on which the frit paste 151 is applied may be placed in a heating furnace, and heated up to a temperature at which the frit glass (sealing material 157) is melted. In this way, the sealing material 157 is integrated with the glass substrate 121.

(2) CF Formation Step

The CF formation step is performed before the frit integration step. However, if the frit paste is placed in the heating furnace and melted therein as described in (1) above, the color filters are deteriorated. Accordingly, the CF formation step may be performed after the frit integration step, and the color filters may be formed by being laminated on the glass substrate in a form of a film.

In other words, the CF process may be performed in order of the CF formation step, the frit paste application step, and the frit integration step, or in order of the frit paste application step, the CF formation step, and the frit integration step.

Embodiment 2

In Embodiment 1, the frit paste 151 is applied on the CF substrate 12. However, the frit paste application step may be performed with respect to the EL substrate. The following describes the EL process including an application step according to Embodiment 2.

One example of the manufacturing method of a display panel 210 includes: an EL preparation process of preparing an EL substrate having a sealing material; a CF preparation process of preparing a CF substrate; and a bonding process of joining and bonding the EL substrate and the CF substrate thus prepared.

(1) CF Preparation Process

In the CF preparation process, a CF substrate is prepared. Specifically, the CF 159 are formed on the glass substrate 121. Since the CF 159 can be formed using the conventional technology, details of the descriptions are omitted.

(2) EL Process

One example of the EL preparation process includes: an application step, which is a step of applying the frit paste 151 on a TFT substrate 221; an integration step, which is a step of integrating the applied frit paste 151 with the TFT substrate 221 with use of the laser 155; and an EL formation step, which is a step of forming light emitting elements (EL) 259 on the TFT substrate 221.

The following describes the EL preparation process in detail, with reference to the drawings.

FIGS. 16A-1 to 16D-2 illustrate the EL process.

Figures 1, 16A:
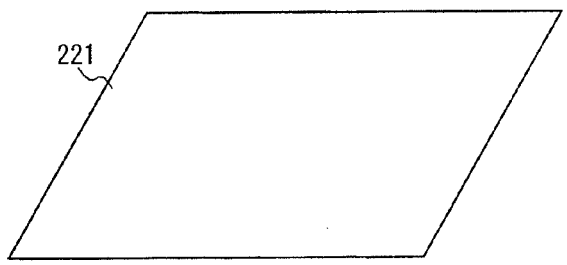
Figures 2, 16A:
Figures 1, 16B:
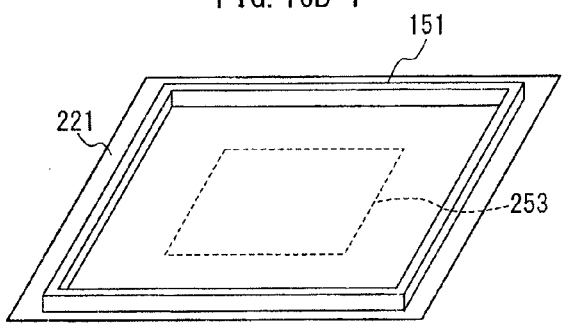
Figures 2, 16B:
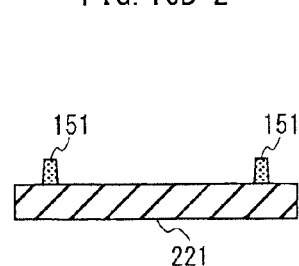
Figures 1, 16C:
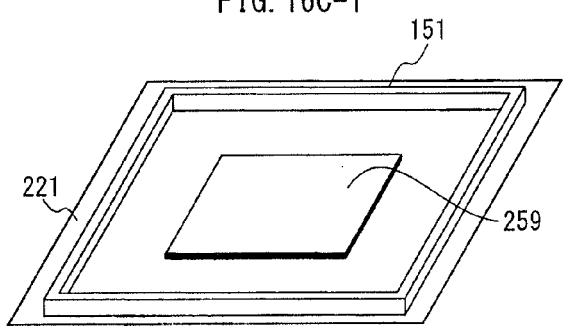
Figures 2, 16C:
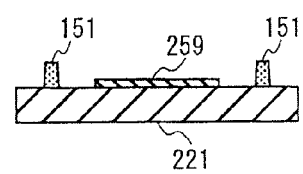
Figures 1, 16D:
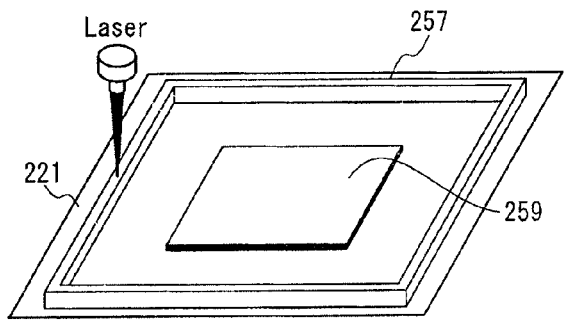
Figures 2, 16D:
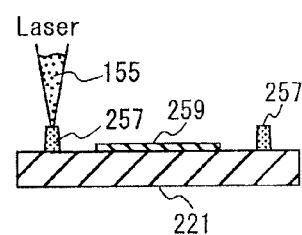

Among these figures, each pair shown side-by-side is related to the same step, where FIGS. 16A-1 to 16D-1 on the left are perspective views.

(a) Application Step

In the application step, the TFT substrate 221 is prepared as shown in FIG. 16A-1. Then, as shown in FIG. 16B-1, the frit paste 151 is applied to a portion of the TFT substrate 221 which corresponds to a sealing portion. Here, the frit paste 151 is applied so as to surround a display region 253 in the same manner as in the application step of the CF process according to Embodiment 1.

(b) EL Formation Step

In the EL formation step, the EL 259 are formed in the display region 253 of the TFT substrate 221 on which the frit paste 151 including a sealing material 257 is applied. Since the EL formation step is performed using the conventional technology, details of the descriptions are omitted.

(c) Frit Integration Step

The frit integration step includes a drying step and a baking step, which are performed in the stated order. In the drying step, the solvent included in the frit paste 151 is removed. In the baking step, the binder and so on are removed from the frit paste 151.

In the present embodiment, the baking step is performed with use of the laser 155, as shown in FIGS. 16D-1 and 16D-2. In this way, the frit glass (glass powder) included in the frit paste 151 is melted and integrated with the TFT substrate 221. Note that a portion (member) obtained as a result of the frit glass being baked and integrated with the TFT substrate 221 is referred to as a sealing material 257.

<Other>

1. Planar Shapes of Start Portion and End Portion

In the above embodiments, the start portion 183 of the frit paste 151 has a triangular shape (in a plan view), and the width thereof increases from the initial part 183a to the final part 183b, and the end portion 185 of the frit paste 151 has a triangular shape (in a plan view), and the width thereof gradually decreases from the initial part 185a to the final part 185b.

However, when only the sealing properties in the display region 153 and the width of the sealing material 157 are considered, the shape of the end portion is not limited to the above, and may take any shape as long as the height at the overlap portion at which the start portion and the end portion overlap is the same as the height of the intermediate portion.

Even in such a case, the upper surface of the end portion and the upper surface of the start portion have the same height and are continuous, thus realizing high sealing properties. Also, by overlapping the start portion and the end portion, the width of the overlap portion at which the start portion and the end portion overlap is smaller than twice the width b of the intermediate portion.

FIGS. 17A to 17E show the shapes of the start portion and the end portion according to Modifications. FIGS. 17A to 17E are plan views showing the start portion and the end portion.

In FIGS. 17A to 17E, center lines E1$a$ to E1$e$ of the respective start portions and center lines E2$a$ to E2$e$ of the respective end portions extend in parallel at respective separation distances Da to De from each other. Each of the separation distances Da to De is less than the width b of the frit paste applied in the intermediate portion (not shown), and is equal to or greater than half the width b of the intermediate portion. Note that each of the separation distances Da to De may be equal to or less than the width b of the frit paste applied in the intermediate portion.

As shown in FIG. 17A, a frit paste 301 is applied such that the center line E1$a$ of a start portion 303 and the center line E2$a$ of an end portion 305 extend in parallel at the separation distance Da from each other. The separation distance Da is less than the width of the frit paste 301 applied in the intermediate portion (not shown). The start portion 303 and the end portion 305 have the same rectangular shape with a constant width.

Note that the end portion 305 overlaps part of the start portion 303. Also, part of the end edge of the end portion 305 overlaps the start portion 303, and part of the start edge of the start portion 303 overlaps the end portion 305.

Figure 17B:
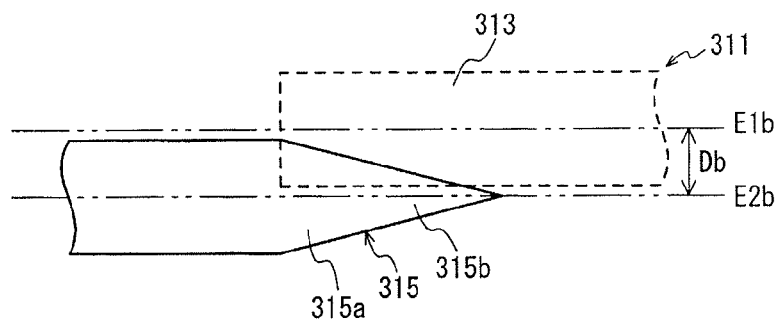

As shown in FIG. 17B, a frit paste 311 is applied such that the center line E1*b* of a start portion 313 and the center line E2*b* of an end portion 315 extend in parallel at the separation distance Db from each other. The separation distance Db is less than the width of the frit paste 311 applied in the intermediate portion (not shown). The start portion 313 has a rectangular shape with a constant width. The end portion 315 has a triangular shape with a width that gradually decreases from an initial part 315*a* to a final part 315*b*.

Note that the end portion 315 overlaps part of the start portion 313, but the end edge of the final part 315*b* of the end portion 315 does not overlap the start portion 31'3.

Figure 17C:
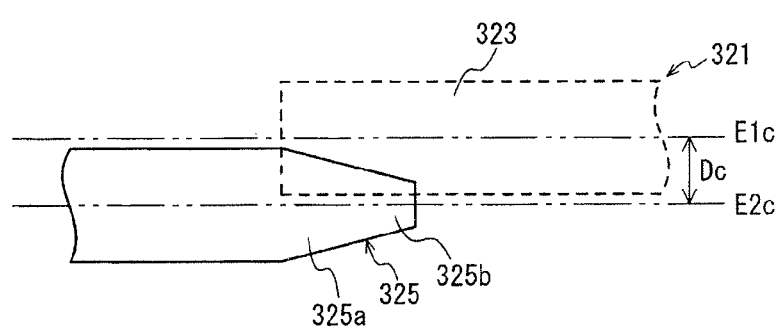
Figure 17D:
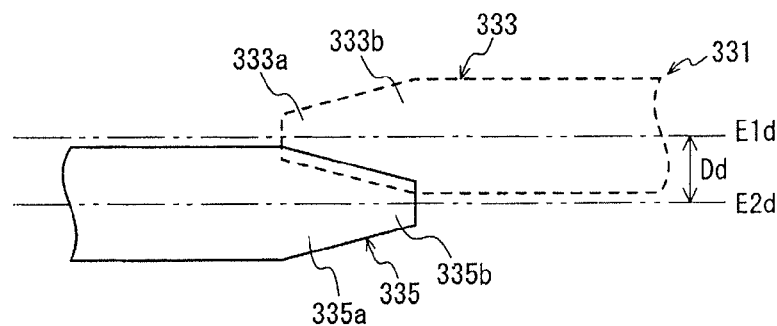
Figure 17E:
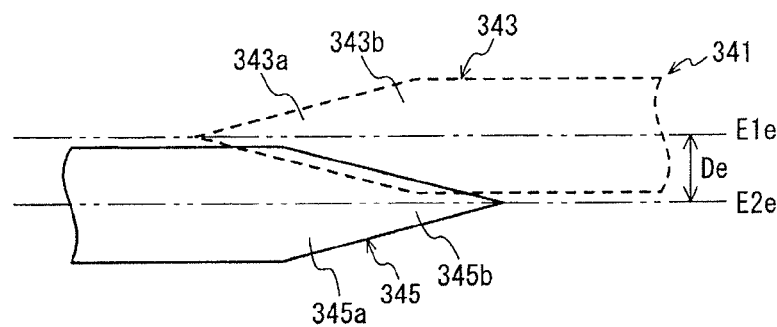

As shown in FIG. 17C, a frit paste 321 is applied such that the center line E1*c* of a start portion 323 and the center line E2*c* of an end portion 325 extend in parallel at the separation distance Dc from each other. The separation distance Dc is less than the width of the frit paste 321 applied in the intermediate portion (not shown). The start portion 323 has a rectangular shape with a constant width. The end portion 325 has a trapezoidal shape with a width that gradually decreases from an initial part 325*a* to a final part 325*b*.

Note that the end portion 325 overlaps part of the start portion 323. Also, part of the end edge of the end portion 325 overlaps the start portion 323, and part of the start edge of the start portion 323 overlaps the end portion 325.

As shown in FIG. 17D, a frit paste 331 is applied such that the center line E1*d* of a start portion 333 and the center line E2*d* of an end portion 335 extend in parallel at the separation distance Dd from each other. The separation distance Dd is less than the width of the frit paste 331 applied in the intermediate portion (not shown). The start portion 333 and the end portion 335 have the same trapezoidal shape. The start portion 333 has a trapezoidal shape with a width that gradually increases from an initial part 333*a* to a final part 333*b*. The end portion 335 has a trapezoidal shape with a width that gradually decreases from an initial part 335*a* to a final part 335*b*.

Note that the end portion 335 overlaps part of the start portion 333. Also, part of the end edge of the end portion 335 overlaps the start portion 333, and part of the start edge of the start portion 333 overlaps the end portion 335.

As shown in FIG. 17E, a frit paste 341 is applied such that the center line E1*e* of a start portion 343 and the center line E2*e* of an end portion 345 extend in parallel at the separation distance De from each other. The separation distance De is less than the width of the frit paste 341 applied in the intermediate portion (not shown). The start portion 343 and the end portion 345 have the same triangular shape. The start portion 343 has a triangular shape with a width that gradually increases from an initial part 343*a* to a final part 343*b*. The end portion 345 has a triangular shape with a width that gradually decreases from an initial part 345*a* to a final part 345*b*.

Note that the end portion 345 overlaps part of the start portion 343. Note that the start edge of the start portion 343 does not overlap the end portion 345, and the end edge of the end portion 345 does not overlap the start portion 343.

2. Cross-Sectional Shapes of Start Portion and End Portion

In "1. Planar Shapes of Start Portion and End Portion" above, the start portion and the end portion have a constant height (thickness) and have different shapes in a plan view. However, it is possible to reduce the thickness of the start portion and the end portion.

Figure 18A:
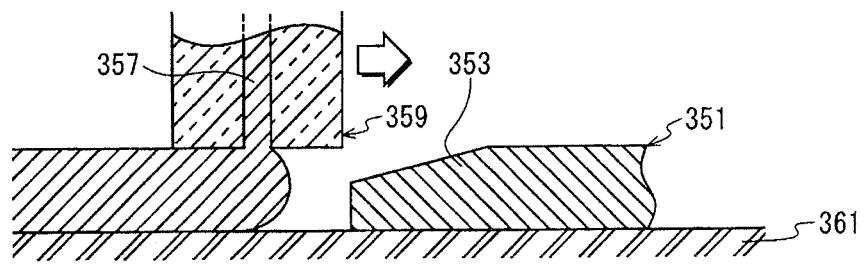
FIGS. 18A to 18C are cross-sectional views showing an example of the start portion and the end portion that have different thicknesses.
Figure 18B:
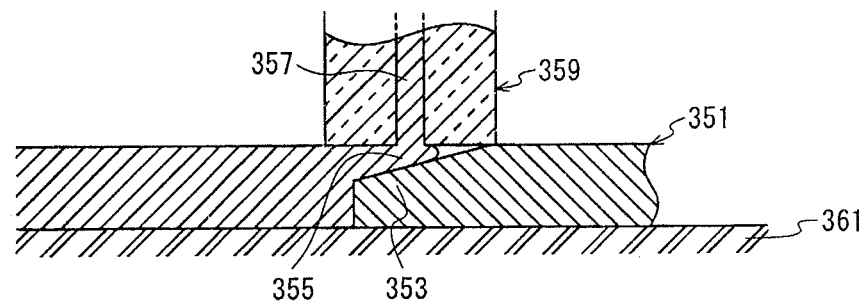
Figure 18C:
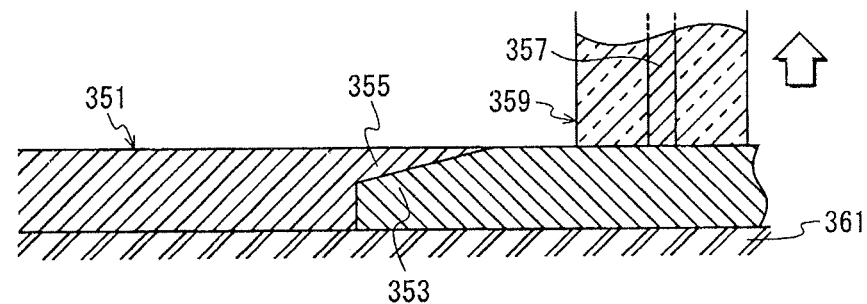

FIGS. 18A to 18C are cross-sectional views showing an example of the start portion and the end portion that have different thicknesses. FIGS. 18A to 18C show states where the start portion and the end portion are applied. Hereinafter, in order to distinguish (i) the frit paste that have been applied and (ii) the frit paste within a nozzle 359 or before application, the former frit paste is denoted by the reference sign "351", and the latter frit paste is denoted by the reference sign "357".

The application of the frit paste 351 to the start region and the end region is performed by means of adjustment of the pressure applied to the frit paste 357 filled in the cylinder. When the pressure within the cylinder is increased, the volume (amount) of the frit paste 357 ejected from the nozzle 359 is increased. When the pressure within the cylinder is set to zero or a negative value, the ejected volume of the frit paste 357 becomes zero. However, as described above, there is a time delay before the ejected volume of the frit paste 357 actually becomes zero. Similarly to the other examples described above, the distance between the nozzle 359 and a substrate 361 in the present example is set to be constant.

At the start of application of the frit paste 357, the pressure is applied within the cylinder so as to eject the frit paste 357. Then, the pressure is gradually increased to a constant value. In this way, a start portion 353 as shown in FIG. 18A is obtained. The width and height of the start portion 353 increases from the initial part to the final part.

When the pressure reaches the constant value, the volume of the frit paste 357 ejected from the nozzle 359 becomes constant. Also, the frit paste 357 is filled between the substrate 361 and the nozzle 359, causing the height of the frit paste 351 after application to be constant. This realizes the intermediate portion having the constant height and the constant width.

As shown in FIG. 18C, during formation of the end portion, the nozzle 359 is moved at a constant height from the substrate 361. In practice, an end portion 355 is formed while the end surface of the nozzle is being lifted from the frit paste 357. Accordingly, when the frit paste 357 within the outlet is ejected outside, the thickness of the end portion 355 becomes large.

However, as described above, by reducing the area over the end portion in which the outlet passes during the formation of the end portion 355, it is possible to prevent the frit paste 357 in the outlet from being pulled outside by the tensile stress.

3. Structure in which Start Portion and End Portion do not Overlap

In the above embodiments and modifications, the start portion and the end portion overlap in the thickness direction thereof. However, the start portion and the end portion do not always need to overlap.

Each of FIGS. 19A to 19E is a plan view of a connected portion at which the start portion and the end portion are connected, and illustrates an example where the start portion and the end portion do not overlap. In FIGS. 19A to 19E, center lines E1*i* to E1*m* of the respective start portions and center lines E2*i* to E1m of the respective end portions extend in parallel at respective separation distances Di to Dm from each other. Each of the separation distances Di to Dm is less than the width b of the frit paste applied in the intermediate portion (not shown).

Figure 19A:
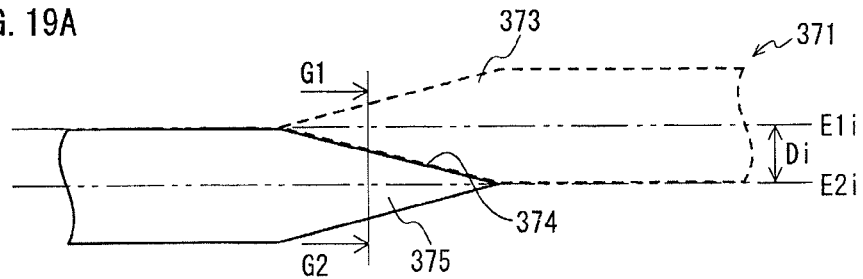

As shown in FIG. 19A, a frit paste 371 is applied such that a start portion 373 and an end portion 375 have the same shape. The planar shape of the start portion 373 is triangular where the width of the paste gradually increases from the initial part to the final part. In other words, the start portion 373 has inclined side faces which, in a plan view, are inclined toward the center line E1*i* of the start portion 373, in a direction approaching the start edge of the start portion 373 from the intermediate portion.

The end portion 375 has a triangular shape where the width of the paste gradually decreases from the initial part to the final part. In other words, the end portion 375 has inclined side faces which, in a plan view, are inclined toward the center line E2i of the end portion 375, in a direction approaching the end edge of the end portion 375 from the intermediate portion. One of the inclined side faces of the start portion 373 opposes one of the inclined side faces of the end portion 375, and the opposing inclined side faces are in contact with each other (see the reference sign 374 in FIG. 19A).

Also, the separation distance Di between the center line E1i of the start portion 373 and the center line E2i of the end portion 375 is half the width b of the intermediate portion. In this way, the start edge of the triangular shaped start portion 373 of the frit paste 371 and the end edge of the triangular shaped end portion 375 of the frit paste 371 are in contact with each other. In other words, the start edge of the frit paste 371 applied in the start region is in contact with the frit paste 371 applied in the end region and in part of the intermediate region adjacent to the end region. Also, the end edge of the frit paste 371 applied in the end region is in contact with the frit paste 371 applied in the start region and in part of the intermediate region adjacent to the start region.

Figure 19B:
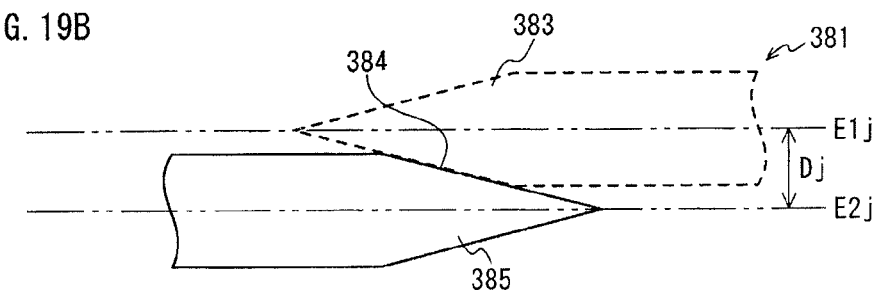

As shown in FIG. 19B, a frit paste 381 is applied such that a start portion 383 and an end portion 385 have the same shape. The start portion 383 and the end portion 385 have a triangular shape, similarly as in FIG. 19A. In FIG. 19B, the start edge of the start portion 383 and the end edge of the end portion 385 protrude without making contact with each other. In other words, the separation distance Dj between the center line E1j of the start portion 383 and the center line E2j of the end portion 385 is less than the width b of the intermediate portion but greater than half the width b of the intermediate portion. The start edge of the start portion 383 is located closer to the intermediate portion than to the end portion 385. The end edge of the end portion 385 is located closer to the intermediate portion than to the start portion 383.

The start portion 383 has inclined side faces which, in a plan view, are inclined toward the center line E1j of the start portion 383, in a direction approaching the start edge of the start portion 383 from the intermediate portion. Also, the end portion 385 has inclined side faces which, in a plan view, are inclined toward the center line E2j of the end portion 385, in a direction approaching the end edge of the end portion 385 from the intermediate portion. One of the inclined side faces of the start portion 383 opposes one of the inclined side faces of the end portion 385, and the opposing inclined side faces are in contact with each other (see the reference sign 384 in FIG. 19B).

Figure 19C:
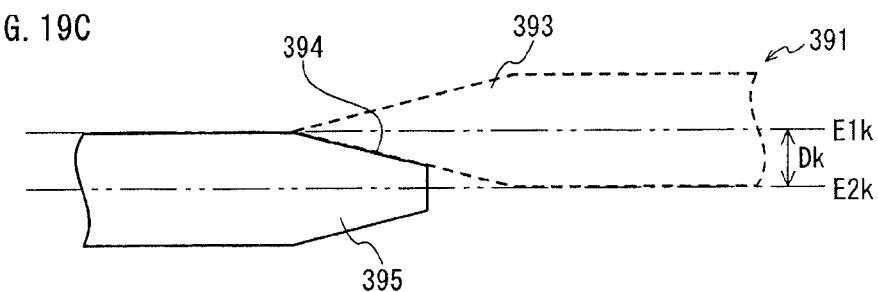

As shown in FIG. 19C, a start portion 393 has a triangular shape, similarly as in FIG. 19B. An end portion 395 has a trapezoidal shape where the width of the paste gradually decreases from the initial part to the final part. A frit paste 391 is applied such that the start edge of the start portion 393 is in contact with the end portion 395.

The start portion 393 has inclined side faces which, in a plan view, are inclined toward the center line E1k of the start portion 393, in a direction approaching the start edge of the start portion 393 from the intermediate portion. Also, the end portion 395 has inclined side faces which, in a plan view, are inclined toward the center line E1k of the end portion 395, in a direction approaching the end edge of the end portion 395 from the intermediate portion. One of the inclined side faces of the start portion 393 opposes one of the inclined side faces of the end portion 395, and the opposing inclined side faces are in contact with each other (see the reference sign 394 in FIG. 19C).

Note that the end edge of the end portion 395 may be flat instead of being tapered as shown in FIGS. 19A and 19B. In this way, when the end portion 395 is formed, the end edge of the end portion 395 does not overlap the start portion 393. As a result, the thickness of the overlap portion at which the end portion 395 and the start portion 393 overlap is prevented from being large.

Figure 19D:
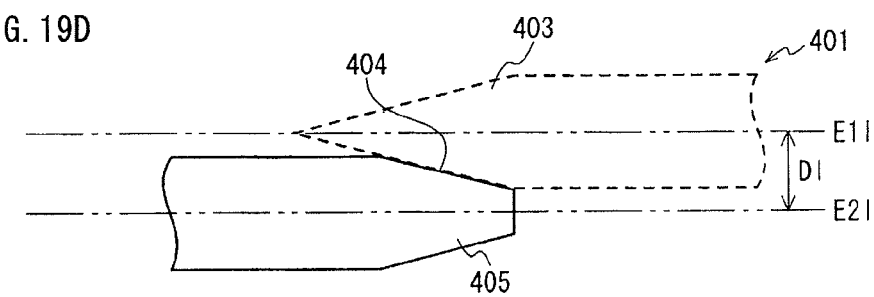

As shown in FIG. 19D, a start portion 403 has a triangular shape, similarly to the start portion 383 shown in FIG. 19B, and an end portion 405 has a trapezoidal shape, similarly to the end portion 395 shown in FIG. 19C. In FIG. 19D, the start edge of the start portion 403 protrudes without making contact with a frit paste 401. The start portion 403 has inclined side faces similar to those of the start portion 383 described above. The end portion 405 has inclined side faces similar to those of the end portion 395 described above. One of the inclined side faces of the start portion 403 opposes one of the inclined side faces of the end portion 405, and the opposing inclined side faces are in contact with each other (see the reference sign 404 in FIG. 19D).

Figure 19E:
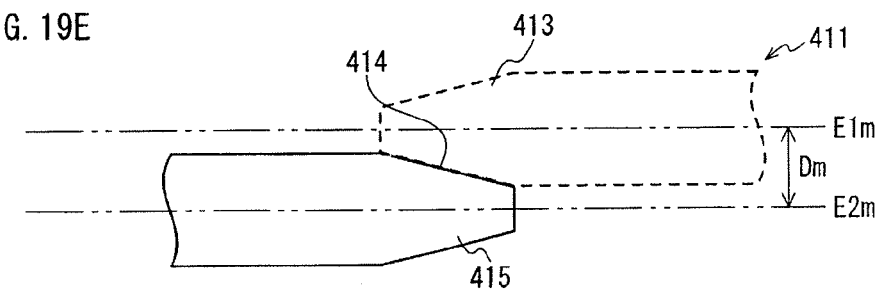

As shown in FIG. 19E, a start portion 413 and an end portion 415 have a trapezoidal shape substantially the same as the shape of the end portion 405 in FIG. 19D. The start portion 413 and the end portion 415 have inclined side faces similar to those of the end portion 405 described above. One of the inclined side faces of the start portion 413 opposes one of the inclined side faces of the end portion 415, and the opposing inclined side faces are in contact with each other (see the reference sign 414 in FIG. 19E).

4. Center Lines of Application

According to the above embodiments, the frit paste is applied such that the center line of the start portion coincides with the center line of part of the intermediate portion adjacent to the start portion, and that the center line of this part of the intermediate portion is separate from and parallel to the center line of the end portion.

However, it is sufficient as long as the frit paste is applied such that at least the center lines of the start portion and the end portion are parallel to and separate from each other by a distance equal to or less than the width b of the frit paste applied in the intermediate region. No limitation is imposed on: the positional relationship between the center line of the start portion and the center line of part of the intermediate portion adjacent to the start portion; and the positional relationship between the center line of the end portion and the center line of part of the intermediate portion adjacent to the end portion.

The following describes modifications regarding the start portion, the end portion, and the intermediate portion.

FIGS. 20A and 20B illustrate the start portion, the end portion, and the intermediate portion according to Modifications.

Note that the positional relationship between the start portion and the end portion described below is merely an example. For example, it does not matter whether the start portion is positioned inward or outward with respect to the end portion. Also, the inclination angle of each of the start portion and the end portion with respect to the intermediate portion is not limited to the angles shown in Examples 1 and 2 below.

(1) Example 1

As shown in FIG. 20A, in Example 1, a start portion 463 juts out in an outer oblique direction with respect to an adjacent intermediate portion 465 which is adjacent to the start portion 463. Also, an end portion 467 juts out in an inner oblique direction with respect to an adjacent intermediate portion 469 which is adjacent to the end portion 467.

In the present example, a center line E1p denotes the center line of the start portion 463 and the intermediate portion 465 adjacent to the start portion 463, and a center line E2p denotes the center line of the end portion 467 and the intermediate portion 469 adjacent to the end portion 467.

Part of the center line E1p that passes through the start portion 463 (i.e., center line of the start portion 463) and part of the center line E2p that passes through the end portion 467 (i.e., center line of the end portion 467) extend separately from and parallel to each other.

Part of the center line E1p that passes through the intermediate portion 465 (i.e., center line of the intermediate portion 465) does not coincide with part of the center line E2p that passes through the intermediate portion 469 (i.e., center line of the intermediate portion 469). Also, the center line of the start portion 463 is not collinear with the center line of the intermediate portion 465 adjacent to the start portion 463, and the center line of the end portion 467 is not collinear with the center line of the intermediate portion 469 adjacent to the end portion 467.

In the present example, the start portion 463 is positioned outward and the end portion 467 is positioned inward. However, this positional relationship between the start portion 463 and the end portion 467 may be the other way around, i.e., the start portion 463 may be positioned inward and the end portion 467 outward. Also, the inclination angle of each of the start portion 463 and the end portion 467 is not specifically limited, but is desirably equal to or less than 45°. This is because the larger the angle is, the larger the width of the frit paste at the connected portion is.

(2) Example 2

In the above embodiments and modifications, the frit paste is applied in a frame pattern so as to surround the display region having a rectangular shape. Also, the start portion and the end portion are located along one of the sides of the rectangle. However, the start portion and the end portion may be located so as to span two adjacent sides out of the four sides of the rectangle. In other words, the connected portion at which the start portion and the end portion are connected may be located at a portion constituting one of the corners of the rectangle.

In Example 2, as shown in FIG. 20B, a start portion 473 and an end portion 477 are located at one of the corners of the rectangular frame surrounding the display region.

An intermediate portion 475 adjacent to the start portion 473 extends in an up-and-down (i.e., longitudinal) direction. The start portion 473 is inclined inward at a predetermined angle (45° in the present example) from a first side (i.e., intermediate portion 475), which is one of two sides constituting the aforementioned corner.

An intermediate portion 479 adjacent to the end portion 477 extends in a left-and-right (i.e., lateral) direction. The end portion 477 is inclined inward at the aforementioned predetermined angle from a second side (i.e., intermediate portion 479) which is the other of the two sides constituting the aforementioned corner.

In the present example, a center line E1q denotes the center line of the start portion 473 and the intermediate portion 475 adjacent to the start portion 473, and a center line E2q denotes the center line of the end portion 477 and the intermediate portion 479 adjacent to the end portion 477.

Part of the center line E1q that passes through the start portion 473 and part of the center line E2q that passes through the end portion 477 extend separately from and parallel to each other.

In the present example, the start portion 473 is positioned inward and the end portion 477 is positioned outward. However, this positional relationship between the start portion 473 and the end portion 477 may be the other way around, i.e., the start portion 473 may be positioned outward and the end portion 477 inward. Also, the above describes that the inclination angle of the start portion 473 and the end portion 477 is 45°. However, the inclination angle may of course be other than 45°.

Note that the start portion and the end portion may be tapered. Also, the separation distance between the center line of the start portion and the center line of the end portion fulfils the same condition as in the case where the center line of the start portion and the center line of the end portion are parallel to each other.

INDUSTRIAL APPLICABILITY

The present disclosure is widely useful for application of paste for sealing.

REFERENCE SIGNS LIST

11. EL Substrate
12. CF Substrate
121 glass substrate
151 frit paste
153 display region
155, 167 laser
157 sealing material (frit glass)

The invention claimed is:
1. A manufacturing method of a display panel, comprising:
 applying a paste including a sealing material to a first substrate by using a nozzle, the nozzle being moved relative to the first substrate along a display region on the first substrate from a start position located in a vicinity of the display region to an end position, so as to surround the display region;
 integrating the sealing material with the first substrate by heating the paste applied to the first substrate; and
 joining the first substrate and a second substrate with the sealing material therebetween, and sealing the first substrate and the second substrate by welding the sealing material to the second substrate, wherein
 in the applying, the paste is applied such that a center line of the paste applied in an end region and a center line of the paste applied in a start region are separate from each other along a main surface of the substrate, the paste being applied continuously in a single motion from the start region through the end region,
 the end region and the start region only partially overlap and the center line of the paste applied in the start region is parallel to the center line of the paste applied in the end region where the end region and the start region overlap in a plan view, and
 a distance of separation in the plan view between the center line of the paste applied in the end region and the center line of the paste applied in the start region is less than a width of the paste applied in a region other than the start region and the end region.
2. The manufacturing method of claim 1, wherein
 the nozzle has a circular outlet from which the paste is ejected, and an end surface located around the outlet and opposing the first substrate, and the distance of the separation is less than (a+b)/2, where a denotes a diameter of the outlet, and b denotes the width of the paste applied in the region other than the start region and the end region.

3. The manufacturing method of claim 2, wherein
a width of the nozzle at the end surface is larger than the width of the paste applied in the region other than the start region and the end region.

4. The manufacturing method of claim 2, wherein
a width of the nozzle is at least twice as large as the diameter of the outlet.

5. The manufacturing method of claim 1, wherein
the paste applied in the start region in the applying has an inclined side face which, in a plan view, is inclined toward the center line of the paste applied in the start region, in a direction approaching a start edge of the paste applied in the start region.

6. The manufacturing method of claim 5, wherein
one of the start region and the end region is located closer to a periphery of the first substrate than the other, the paste applied in the region closer to the periphery has an inclined side face positioned at an inner side of the paste, the paste applied in the other one of the start region and the end region has an inclined side face positioned at an outer side of the paste, and the inclined side face at the inner side and the inclined side face at the outer side overlap.

7. The manufacturing method of claim 1, wherein
the paste applied in the end region in the applying has an inclined side face which, in a plan view, is inclined toward the center line of the paste applied in the end region, in a direction approaching an end edge of the paste applied in the end region.

8. The manufacturing method of claim 7, wherein
one of the start region and the end region is located closer to a periphery of the first substrate than the other, the paste applied in the region closer to the periphery has an inclined side face positioned at an inner side of the paste, the paste applied in the other one of the start region and the end region has an inclined side face positioned at an outer side of the paste, and the inclined side face at the inner side and the inclined side face at the outer side overlap.

9. The manufacturing method of claim 1, wherein
the distance of the separation is greater than half the width of the paste applied in the region other than the start region and the end region.

10. The manufacturing method of claim 1, wherein
the width of the paste applied in the region other than the start region and the end region is equal to a maximum width of the paste applied in the start region.

11. The manufacturing method of claim 1, wherein
in the applying, the paste applied in part of the end region at least partially overlaps the paste applied in the start region, the part being located closer to the end position than other part of the end region.

12. The manufacturing method of claim 1, wherein
in the applying, the paste applied in the end region overlaps the paste applied in part of the start region, the part being located closer to the start position than other part of the start region.

13. The manufacturing method of claim 1, wherein
the nozzle is moved at a predetermined distance from the first substrate.

14. The manufacturing method of claim 1, wherein
the nozzle is moved while maintaining a predetermined distance from the first substrate, regardless of whether in the start region, the end region, or the region other than the start region and the end region.

15. The manufacturing method of claim 1, wherein
after the first substrate and the second substrate are joined with the sealing material therebetween in the joining, the sealing material is melted by irradiating the sealing material with a laser beam.

16. A manufacturing method of a display panel having an organic EL element, comprising:
applying a paste, including a sealing material made of glass, to a first substrate by using a nozzle, the nozzle being moved relative to the first substrate along a display region on the first substrate from a start position located in a vicinity of the display region to an end position, so as to surround the display region;
integrating the sealing material with the first substrate by heating the paste applied to the first substrate; and
joining the first substrate and a second substrate with the sealing material therebetween, and sealing the first substrate and the second substrate by welding the sealing material to the second substrate, wherein
in the applying, the paste is applied such that a center line of the paste applied in an end region and a center line of the paste applied in a start region are separate from each other along a main surface of the substrate, the paste being applied continuously in a single motion from the start region through the end region,
the end region and the start region only partially overlap and the center line of the paste applied in the start region is parallel to the center line of the paste applied in the end region where the end region and the start region overlap in a plan view, and
a distance of separation in the plan view between the center line of the paste applied in the end region and the center line of the paste applied in the start region is less than a width of the paste applied in a region other than the start region and the end region.

* * * * *